United States Patent
Lee et al.

(10) Patent No.: US 8,017,491 B2
(45) Date of Patent: Sep. 13, 2011

(54) METHOD FOR FABRICATING CAPACITOR

(75) Inventors: Kee-Jeung Lee, Ichon-shi (KR);
Jae-Sung Roh, Ichon-shi (KR);
Seung-Jin Yeom, Ichon-shi (KR);
Han-Sang Song, Ichon-shi (KR);
Deok-Sin Kil, Ichon-shi (KR);
Young-Dae Kim, Ichon-shi (KR);
Jin-Hyock Kim, Ichon-shi (KR);
Kwan-Woo Do, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 190 days.

(21) Appl. No.: 11/965,698

(22) Filed: Dec. 27, 2007

(65) Prior Publication Data
US 2009/0004808 A1 Jan. 1, 2009

(30) Foreign Application Priority Data
Jun. 27, 2007 (KR) ........................ 10-2007-0063768

(51) Int. Cl.
*H01L 21/20* (2006.01)
(52) U.S. Cl. ....................................... 438/386; 257/302
(58) Field of Classification Search .................. 438/386
See application file for complete search history.

(56) References Cited

U.S. PATENT DOCUMENTS

| 7,053,435 | B2 | 5/2006 | Yeo et al. | |
|---|---|---|---|---|
| 2005/0176210 | A1* | 8/2005 | Kim et al. | 438/386 |
| 2005/0287738 | A1* | 12/2005 | Cho et al. | 438/253 |
| 2006/0003582 | A1 | 1/2006 | Roh | |
| 2006/0099768 | A1 | 5/2006 | Yokoi | |
| 2006/0134854 | A1 | 6/2006 | Park et al. | |
| 2006/0186453 | A1* | 8/2006 | Park | 257/308 |
| 2007/0049037 | A1* | 3/2007 | Graettinger et al. | 438/700 |

FOREIGN PATENT DOCUMENTS

| JP | 2005-032982 | 2/2005 |
|---|---|---|
| KR | 1020050045608 A | 5/2005 |
| KR | 1020060068199 A | 6/2006 |
| KR | 10-0799152 B1 | 1/2008 |

OTHER PUBLICATIONS

Korean Intellectual Property Office, Notice of Preliminary Rejection, Application No. 10-2007-0063768, Apr. 24, 2008.

* cited by examiner

*Primary Examiner* — Quoc D Hoang
*Assistant Examiner* — Tony Tran
(74) *Attorney, Agent, or Firm* — Kilpatrick Townsend & Stockton LLP

(57) ABSTRACT

A method for fabricating a capacitor includes forming a sacrificial layer having a plurality of trenches on an upper portion of a substrate, forming storage nodes in the trenches, exposing upper portions of the storage nodes by removing a portion of the sacrificial layer, forming supporters to support the exposed upper portions of the storage nodes, removing the sacrificial layer under the supporters, and removing the supporters.

32 Claims, 27 Drawing Sheets

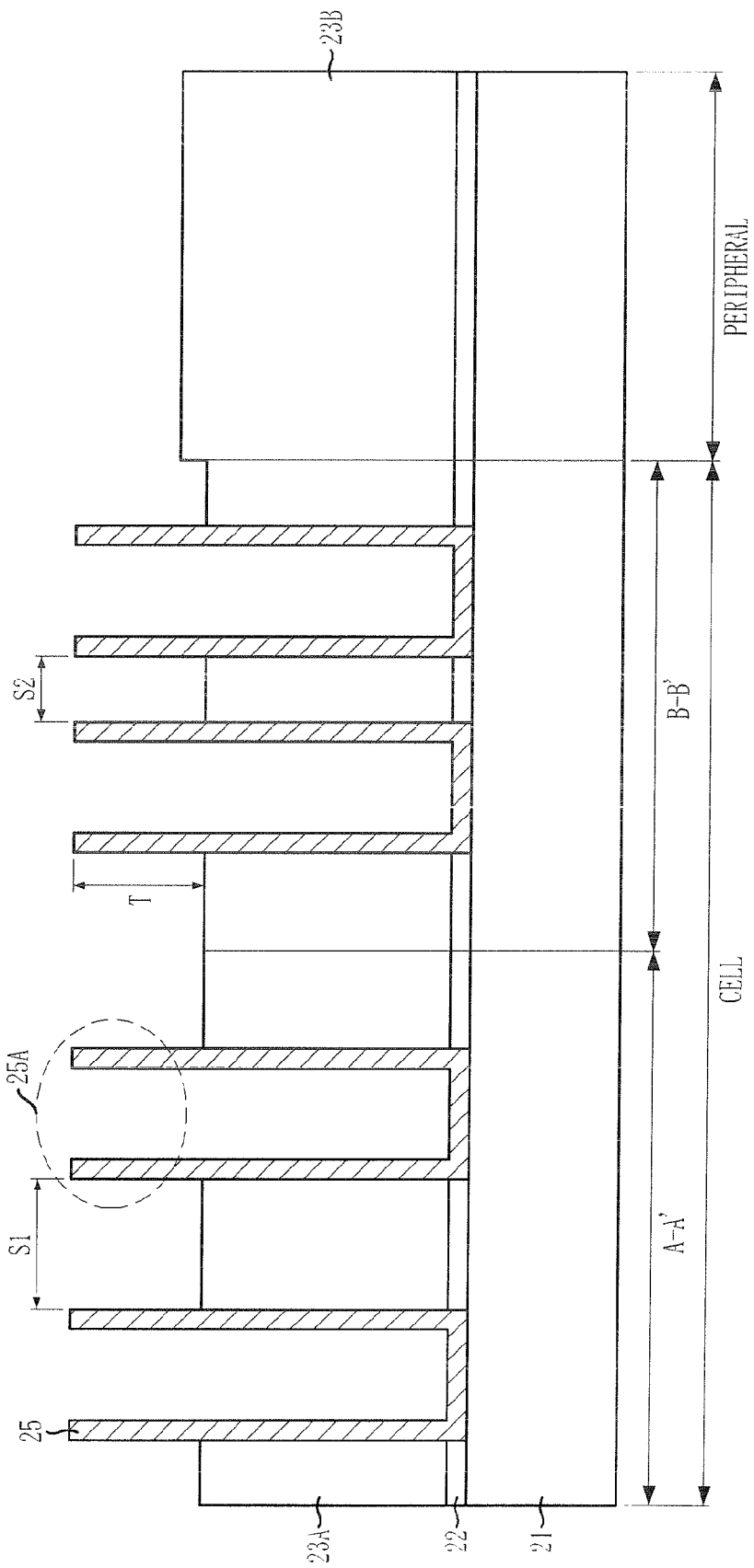

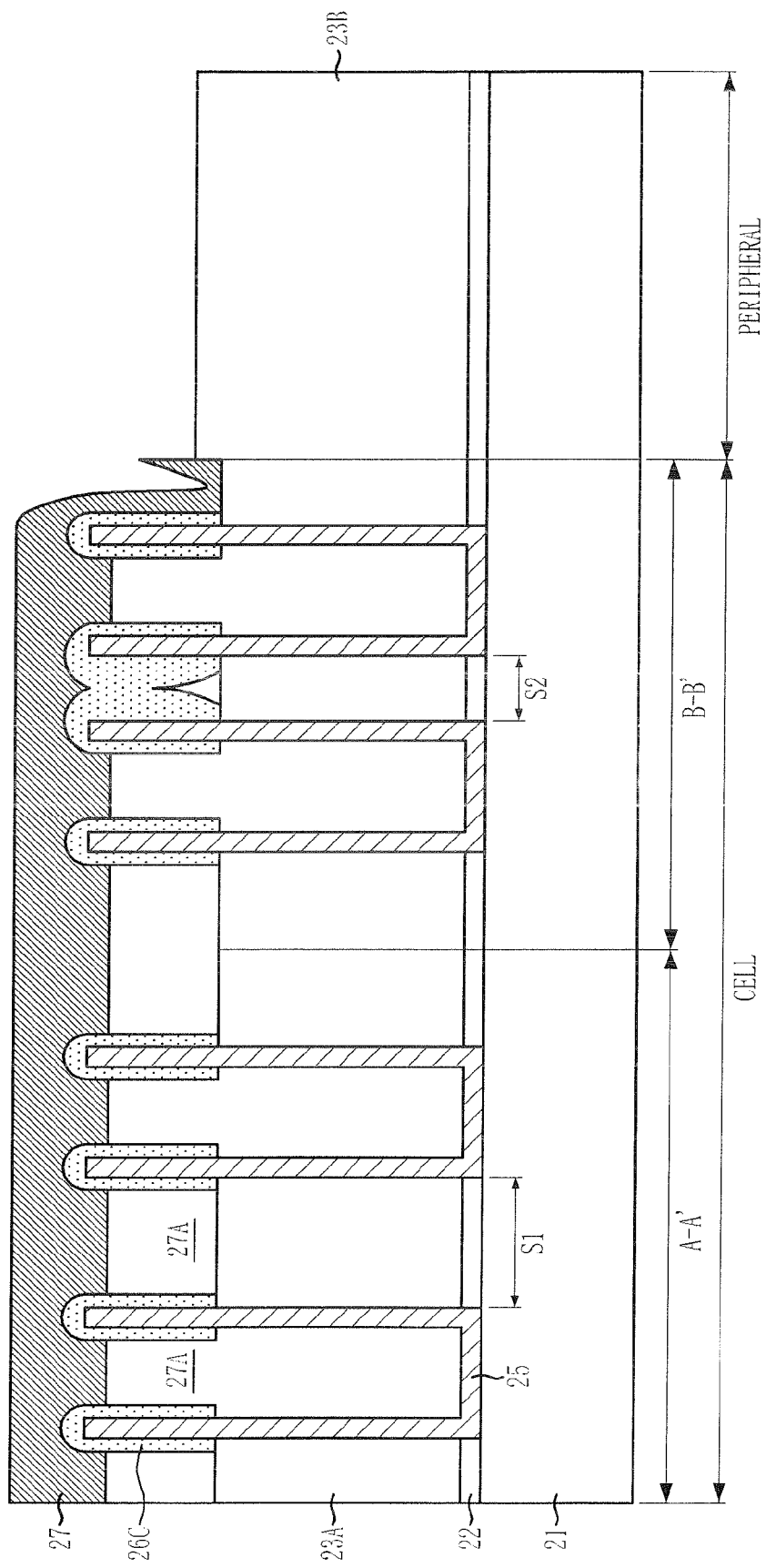

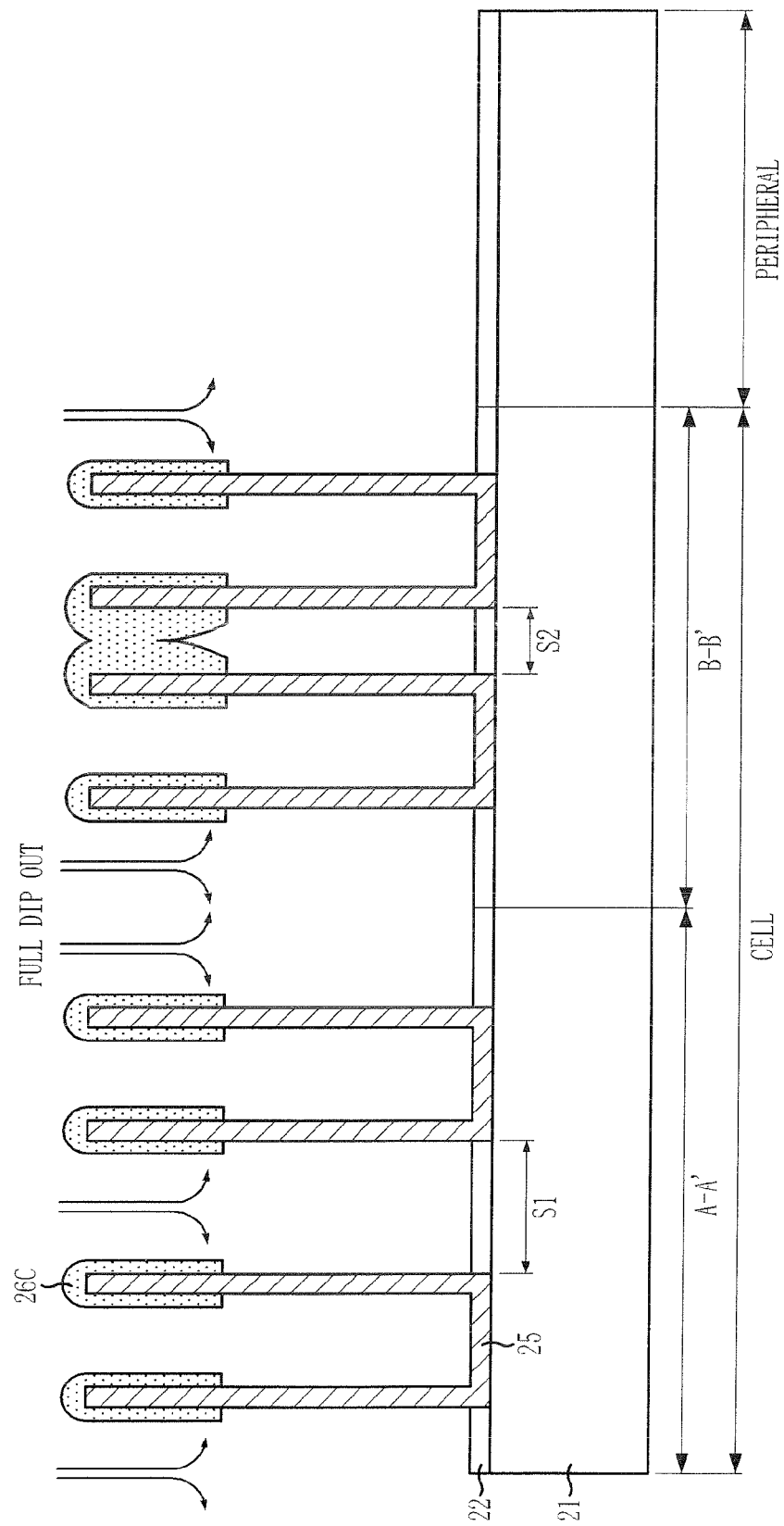

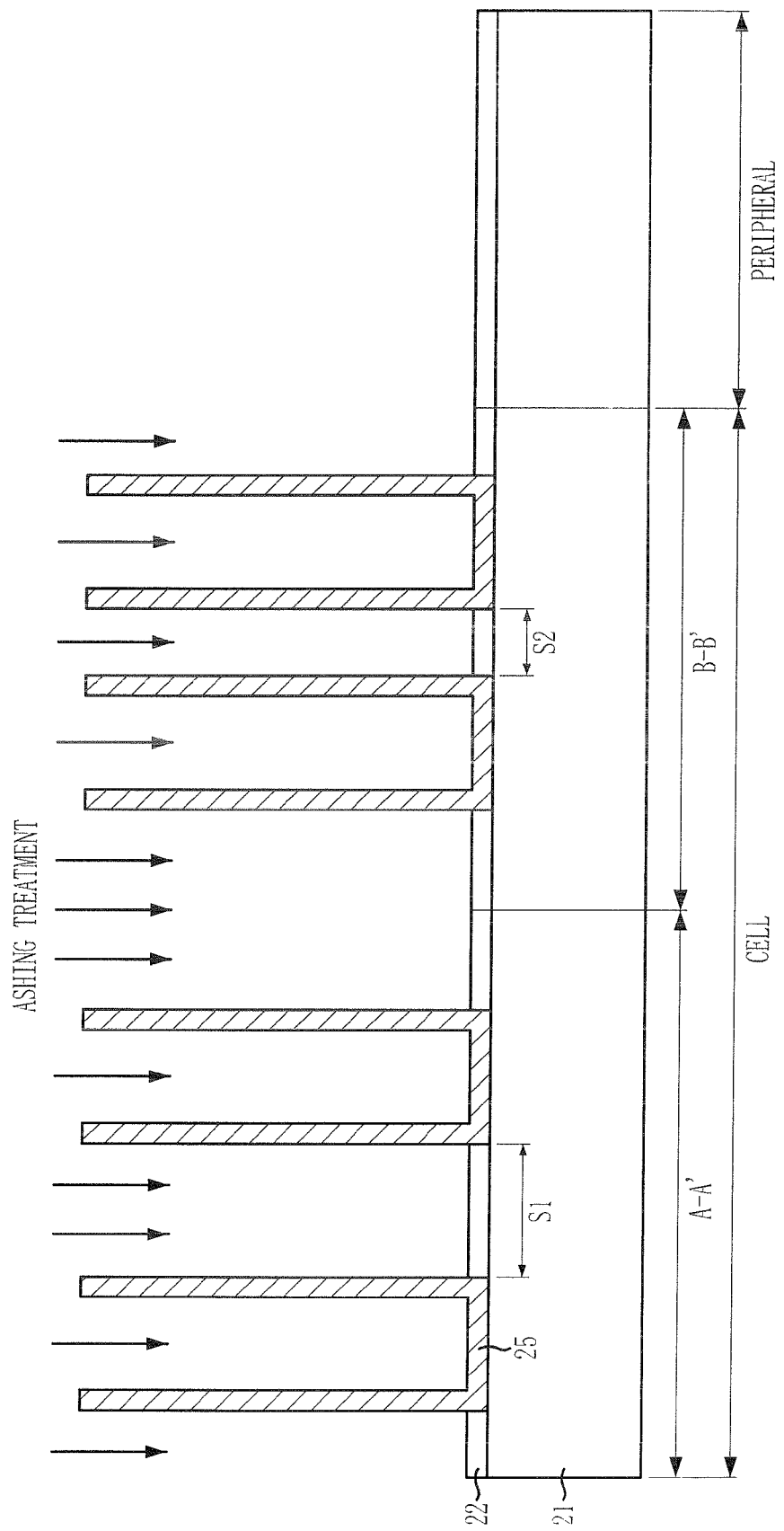

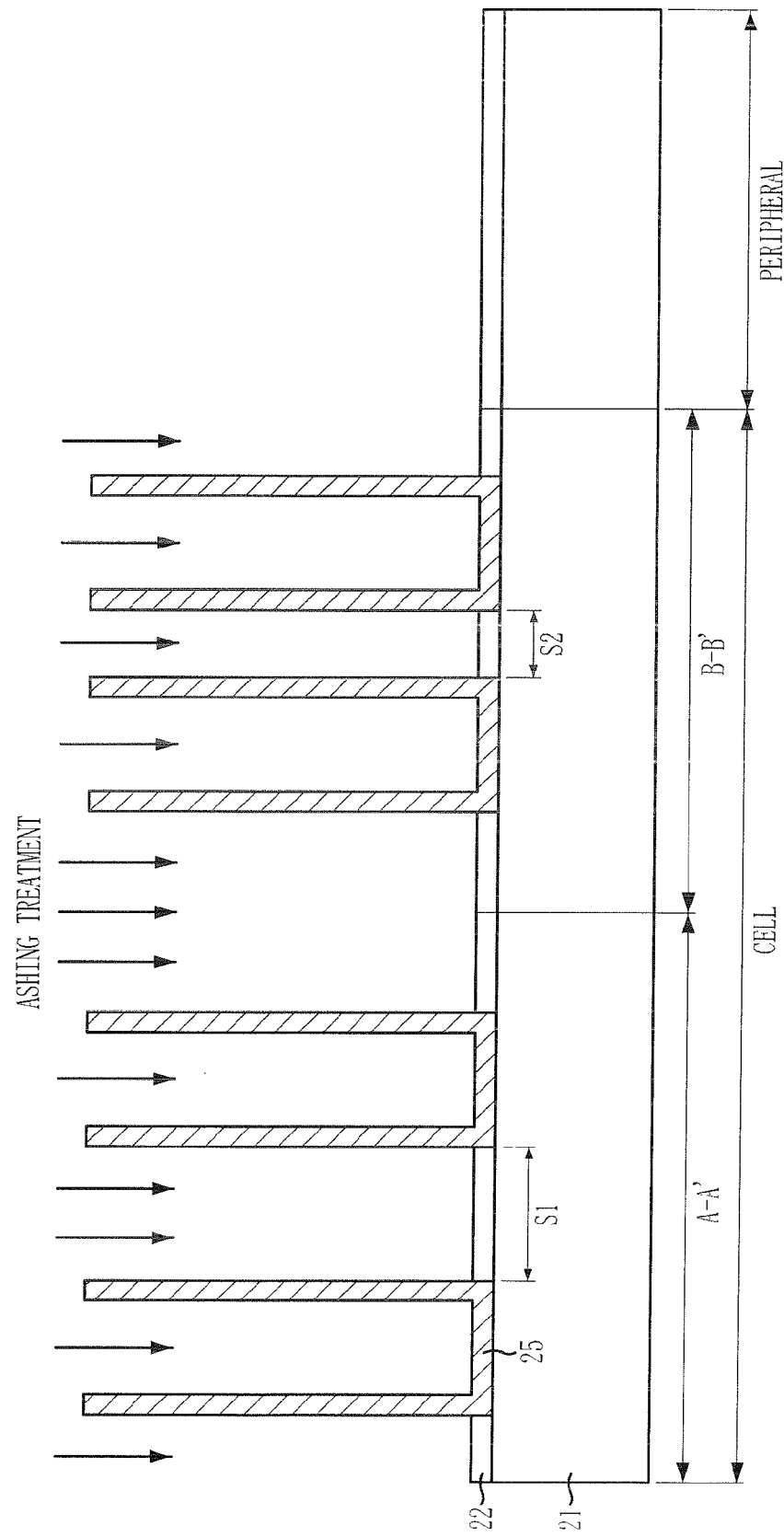

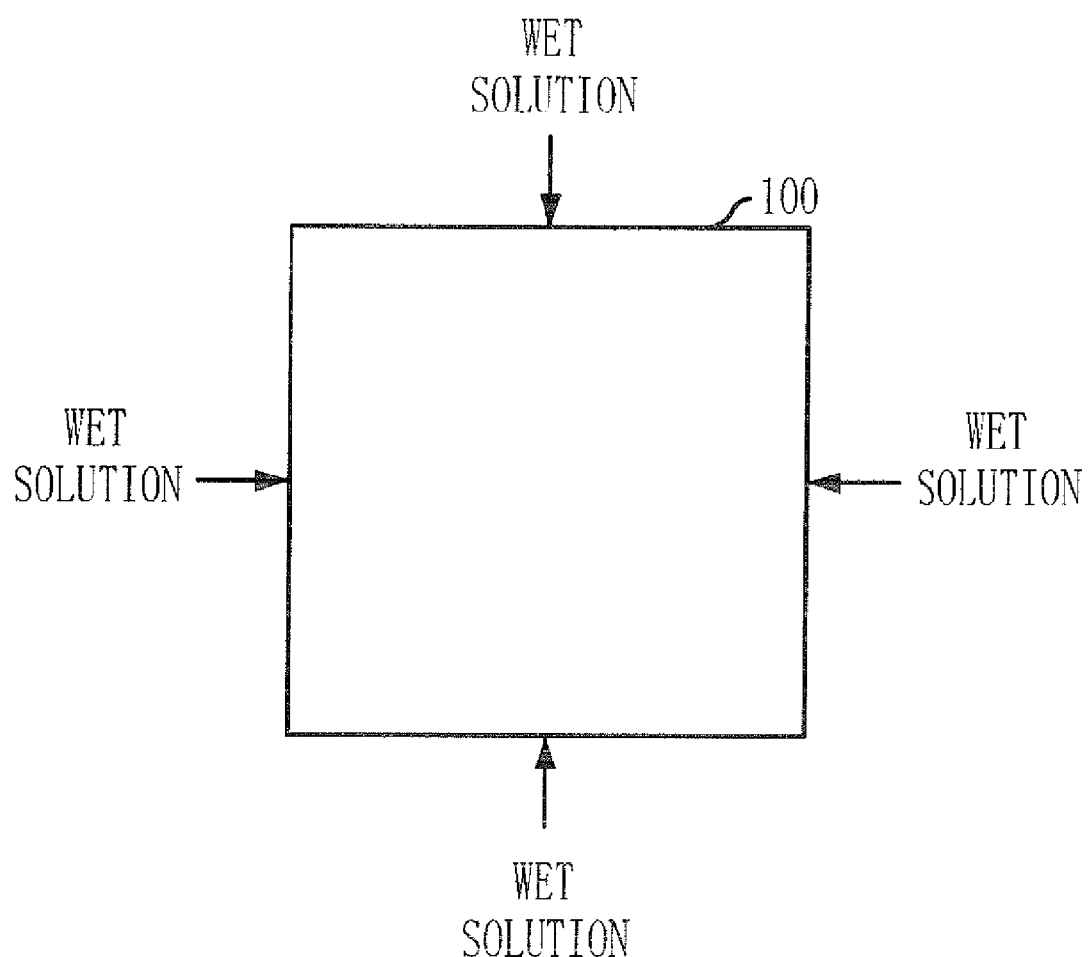

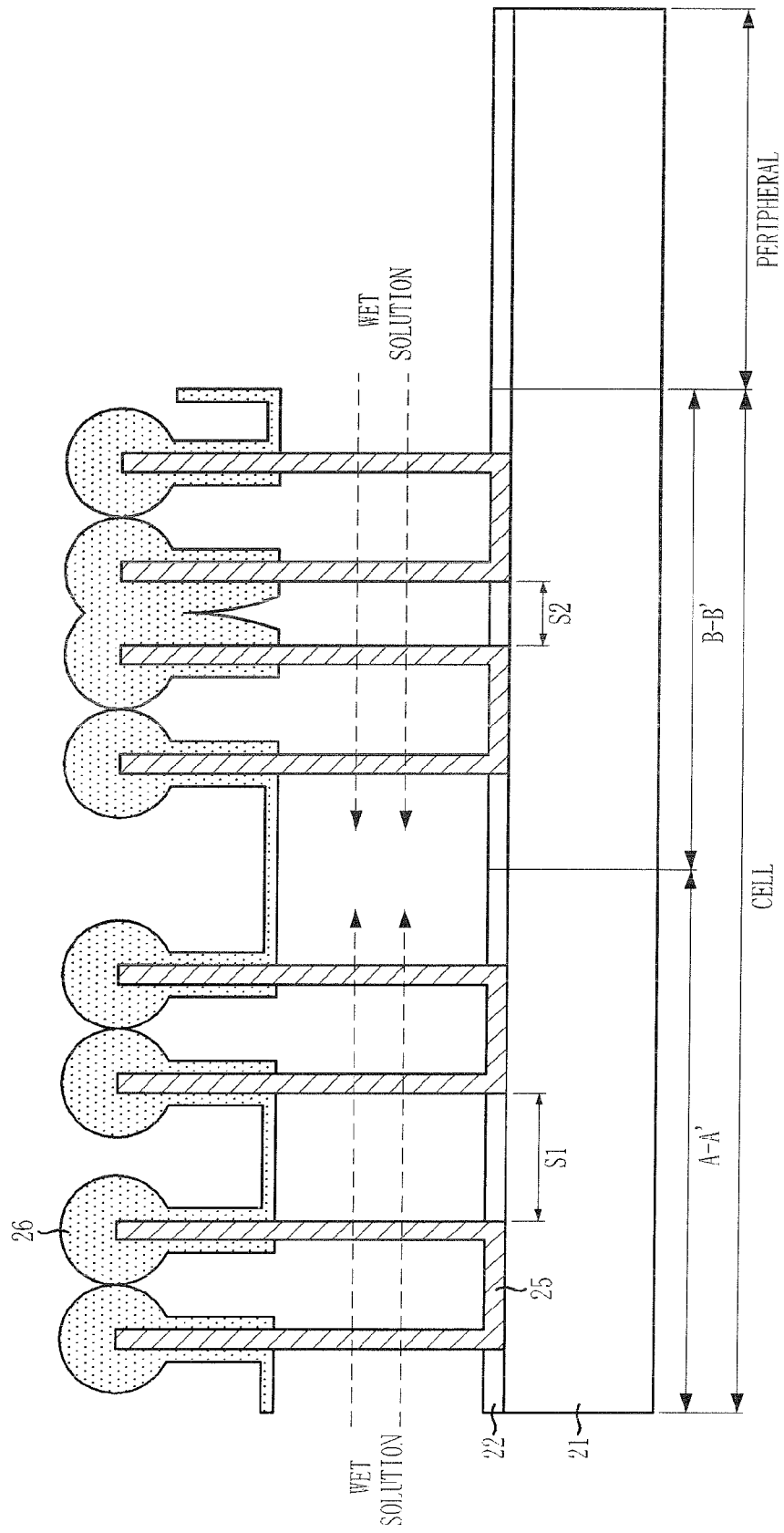

METHOD FOR FABRICATING CAPACITOR

CROSS-REFERENCE TO RELATED APPLICATIONS

The present invention claims priority of Korean patent application number 10-2007-0063768, filed on Jun. 27, 2007, which is incorporated by reference in its entirety.

BACKGROUND OF THE INVENTION

The present invention relates to a semiconductor fabricating method, and, more particularly, to a method for fabricating a capacitor.

Recently, as an integration of memory devices increases due to demands for micro-sized semiconductors, a unit cell region decreases and an operational voltage decreases. However, even though the cell region is reduced in size, the memory device still requires a charge capacitance of at least 25 fF/cell to prevent soft errors from occurring and to prevent a refresh time from being shortened.

A high dielectric layer having a high dielectric constant, such as a hafnium oxide ($HfO_2$) layer and a zirconium oxide ($ZrO_2$) layer, has been developed to ensure an equivalent oxide thickness ($T_{OX}$) within a range of about 10±2 Å. Thus, a metal-insulator-metal (MIM) capacitor based on a concave-shaped storage node structure has been employed for 80 nm-level dynamic random access memory (DRAM) devices. However, since semiconductor DRAM devices employing a metallization process of less than a 70 nm-level cannot sufficiently ensure an effective area of about 0.84 $\mu m^2$/cell in the concave-shaped storage node structure, the semiconductor DRAM devices cannot obtain a cell capacitance over 25 fF/cell. Accordingly, the MIM capacitor having a cylindrical structure is employed in 60 nm-level devices.

FIG. 1 illustrates a conventional storage node having a cylindrical structure.

A plurality of cylindrical storage nodes 12 are formed over a lower layer 11. In order to fabricate the cylindrical storage nodes 12, a wet etching process (referred to as a full dip out process) using a sacrificial layer and a drying process are performed. When a ratio of a height H of the storage node 12 to a width W of the storage node 12 exceeds approximately 12:1, water marks existing between neighboring storage nodes may be evaporated in the drying process after the wet etching process, resulting in a leaning phenomenon.

Since a dual bit failure results due to a storage node bridge (SN bridge) caused by the leaning phenomenon as shown in FIG. 2, a method for increasing the height of the storage node to obtain a charge capacitance of more than 25 fF/cell is limited.

FIG. 2 illustrates a storage node bridge formed in a conventional method for forming cylindrical storage nodes. The storage node bridge is caused due to the leaning phenomenon between neighboring storage nodes. Accordingly, an alternative technology capable of overcoming the above limitation is required in an under 60 nm-level DRAM.

SUMMARY OF THE INVENTION

Embodiments of the present invention are directed to a method for fabricating a capacitor, capable of preventing a leaning phenomenon when fabricating a cylindrical storage node.

In accordance with an aspect of the present invention, a method for fabricating a capacitor includes forming a sacrificial layer on an upper portion of a substrate. Pluralities of trenches are formed in the sacrificial layer. Cylindrical storage nodes are formed in the trenches. An upper portion of each storage node is exposed by removing a portion of the sacrificial layer. Supporters are formed to support the exposed upper portions of the storage nodes. The sacrificial layer under the supporters is removed. The supporters are then removed.

In accordance with another aspect of the present invention, a method for fabricating a capacitor includes forming a sacrificial layer on a cell region of a substrate. The substrate also has a peripheral region. Pluralities of trenches are formed in the sacrificial layer. Storage nodes are formed in the trenches. An upper portion of each storage node is exposed by removing a portion of the sacrificial layer. Supporters are formed to support an exposed upper portion of the sacrificial layer and the exposed upper portions of the storage nodes. A capping layer is formed on the supporters. The capping layer is removed from the peripheral region using a mask that covers the cell region and exposes the peripheral region. The mask is removed in the cell region and the supporters are removed in the peripheral region. The capping layer in the cell region and the sacrificial layer remaining in the cell region and the peripheral region are removed. The supporters in the cell region are then removed.

BRIEF DESCRIPTION OF THE DRAWINGS

FIGS. 3A to 3I illustrate cross-sectional views of a method for fabricating a capacitor with a cylindrical storage node according to a first embodiment of the present invention.

FIGS. 5A to 5D illustrate cross-sectional views of a method for fabricating a capacitor with a cylindrical storage node according to a second embodiment of the present invention.

FIG. 6A illustrates a schematic view of a full dip out process according to a third embodiment of the present invention.

FIGS. 6B and 6C illustrate cross-sectional views of a method for fabricating a capacitor with a cylindrical storage node according to the third embodiment of the present invention.

DETAILED DESCRIPTION OF THE PREFERRED EMBODIMENTS

Figure 1:
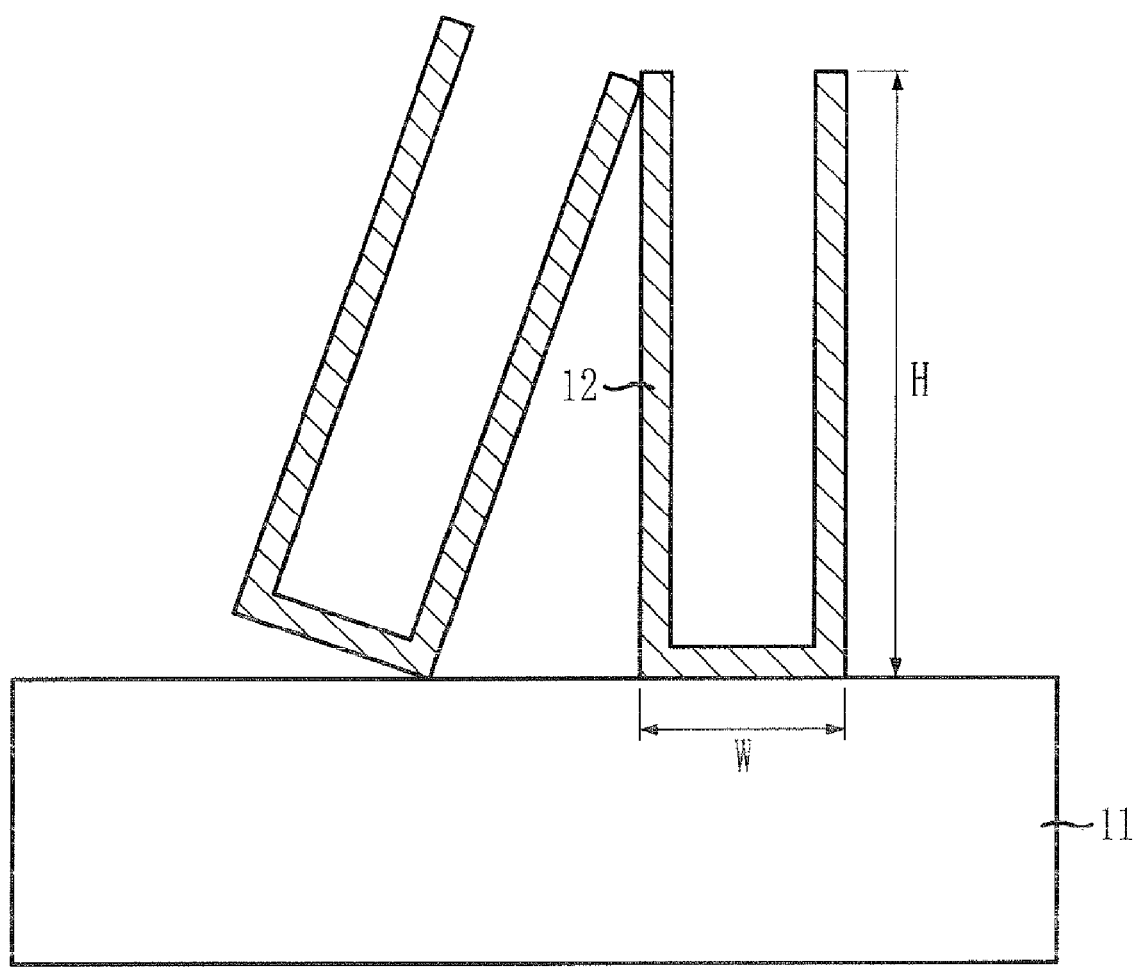
FIG. 1 illustrates a conventional cylindrical storage node.
Figure 2:
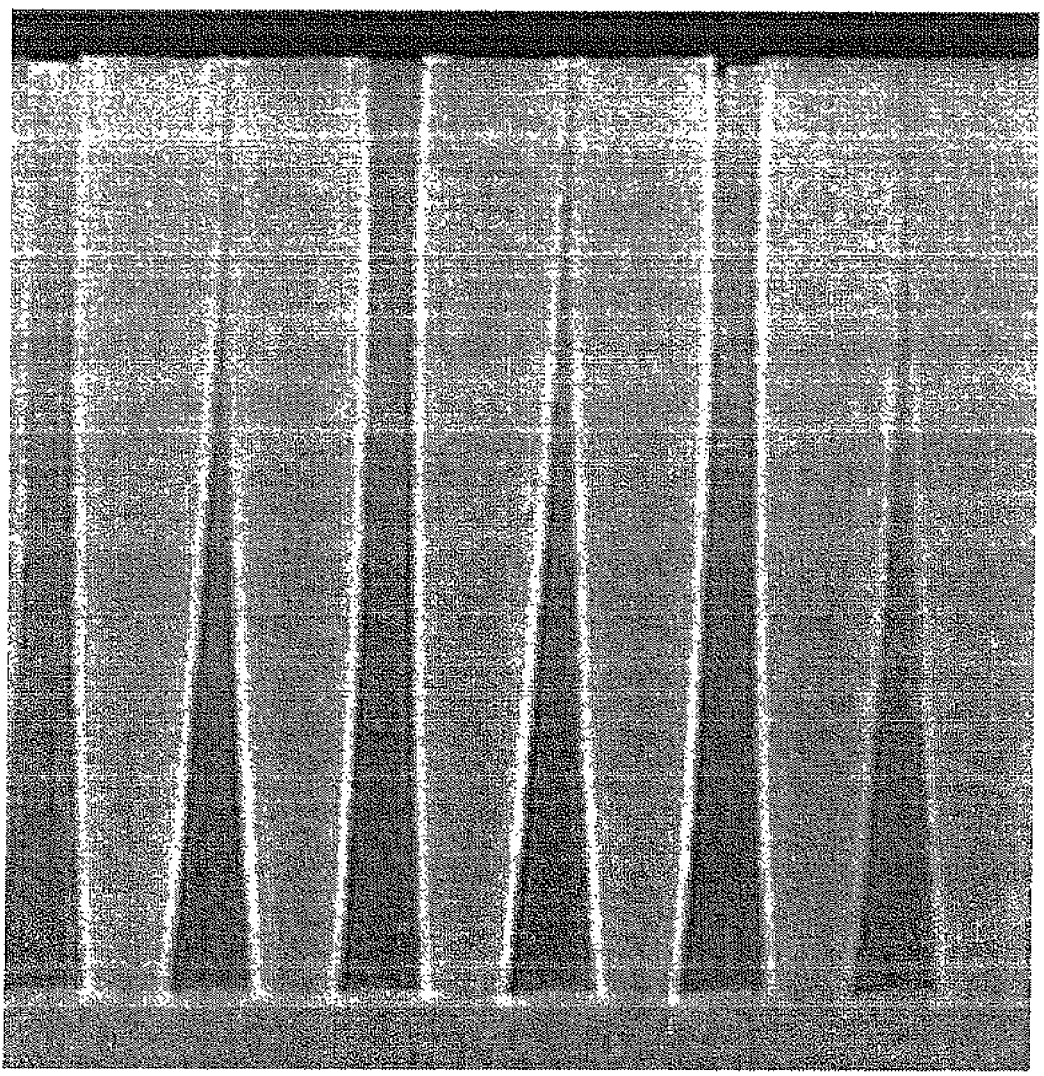
FIG. 2 illustrates a storage node bridge formed in a conventional method for forming cylindrical storage nodes.

The present invention relates to a method for fabricating a capacitor. The capacitor is capable of overcoming a dual bit failure due to a bridge resulting from a leaning phenomenon between neighboring storage nodes in a wet etching process. The leaning phenomenon may result when a height of a storage node is increased to obtain greater cell capacitance by increasing an area of a storage node. The storage node may be cylindrical. Cylindrical storage nodes are commonly employed for under 60 nm-level dynamic random access memory (DRAM). The method in accordance with the present invention allows the height of the cylindrical storage node to exceed a conventional level.

In order to fabricate a cylindrical storage node, a wet etching process employing a diluted hydrogen fluoride (HF) solution or a buffered oxide etchant (BOE) solution (e.g., a mixed solution of ammonium difluoride ($NH_4F$) and HF) and a drying process are performed. Since the cylindrical storage node has a hydrophobic property, a water mark may be formed while the storage node is being moved to a rinse bath after being dipped into the solution during the wet etching process. If a water mark is formed, a bridge may also be formed between neighboring storage nodes. Accordingly, the water mark should be prevented from being formed while the storage node is moved or during a subsequent drying process.

The likelihood of the formation of the water mark increases when a surface tension, a contact angle and a height of the storage node are increased, and when an inertia moment and the value of Young's modulus of the storage node are reduced. However, the formation of the water mark is not completely removed in a wet etching process and a drying process.

The following embodiments describe a method of performing the wet etching process (referred to as a full dip out process) and the drying process by forming a mesh-shaped supporter. The mesh-shaped supporter supports the storage nodes to prevent leaning of a storage node during the wet etching process and the drying process. The supporter is then removed.

In order to realize the above method, amorphous carbon formed by a plasma enhanced-chemical vapor deposition (PE-CVD) method is used for forming the supporter. The amorphous carbon having a low step-coverage is formed over the storage node by controlling a ratio of open areas which are formed in longitudinal and transverse directions due to a zigzag arrangement of cylindrical storage nodes in a memory cell array area. The supporter having the mesh structure is formed over an upper portion of the storage nodes by a spacer etching process using dry etching.

In order to form the supporter having the mesh structure including the amorphous carbon on the upper portion of the storage nodes, a pattern is formed by repeating the wet etching process and the dry etching process at least once. Thus, defects such as polymer residues or a mass of amorphous carbon may be generated. Therefore, according to the present invention, a process scheme capable of fabricating amorphous carbon mesh structures, which can be easily mass produced, is employed to effectively control hard defects that degrade product yield.

The following embodiments relate to a method for fabricating a capacitor with a cylindrical storage node having an aspect-ratio of a height to a bottom width that exceeds approximately 12:1.

FIGS. 3A to 3I illustrate cross-sectional views of a method for fabricating a capacitor with a cylindrical storage node according to a first embodiment of the present invention.

Figure 3A:
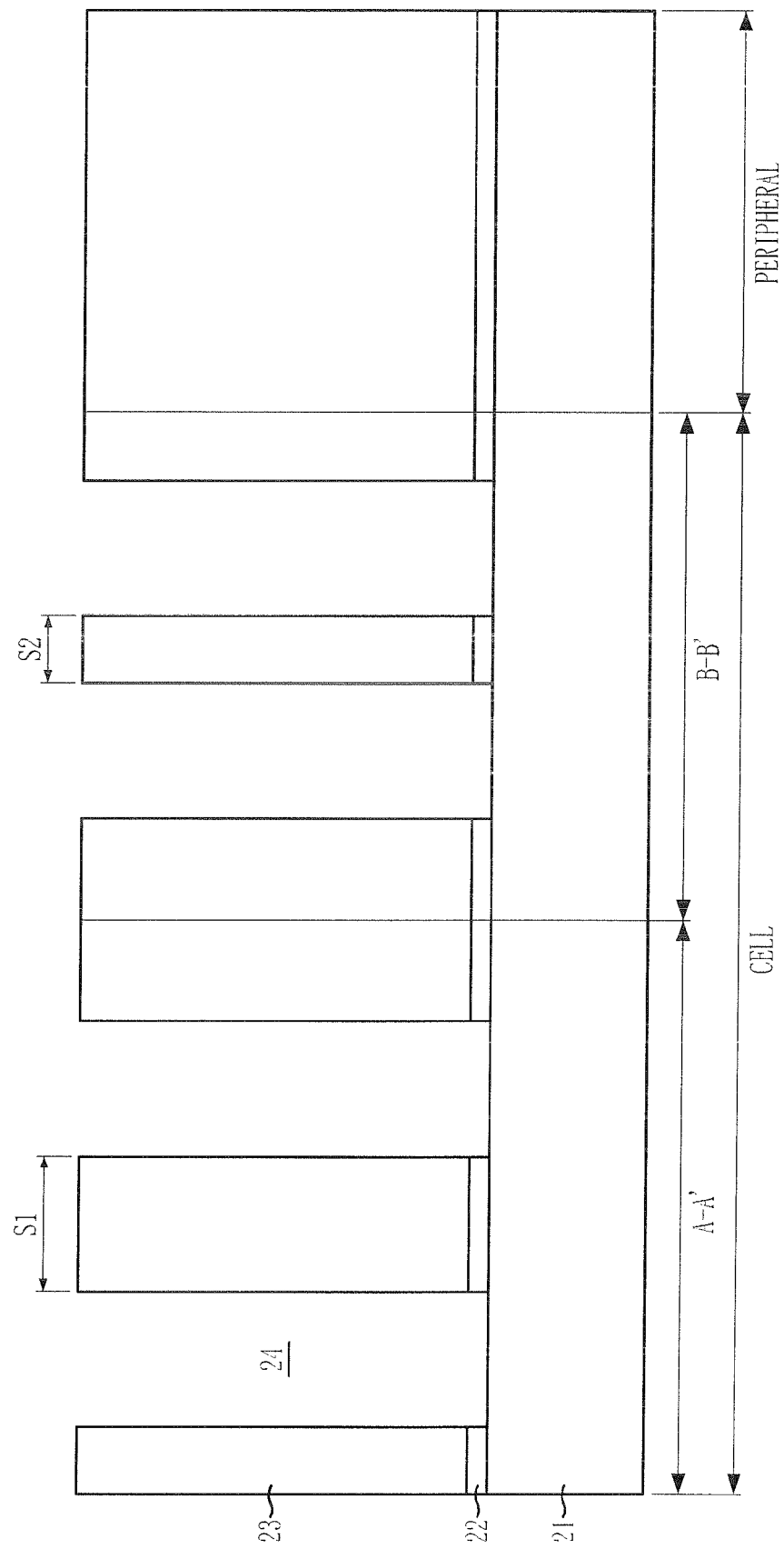

As shown in FIG. 3A, a substrate 21 is provided with word lines (not shown), bit lines (not shown), and an insulation layer. The insulation layer has a multi-layer structure, and includes an oxide layer. The substrate 21 includes a cell region and a peripheral region. The cell region is divided into a first region along the line A-A' and a second region along the line B-B'. The first region is separated from the second region because the storage nodes of the capacitor are formed in a zig-zag pattern. The first region along the line A-A' has a first portion S1 having a wide interval between neighboring storage nodes, and the second region along the line B-B' has a second portion S2 having a narrow interval between neighboring storage nodes. Although it is not shown, the substrate 21 has storage node contact plugs. The storage node contact plugs are formed by forming a polysilicon layer, performing a chemical mechanical polishing (CMP) process, and performing an etch-back process after a contact hole is formed. A barrier metal layer may be formed over the storage node contact plugs. The barrier metal may include titanium (Ti) or titanium nitride (TiN). Furthermore, the barrier metal may have a stacked layer including a Ti layer and a TiN layer.

An etching barrier layer 22 and a sacrificial layer 23 are sequentially formed over the substrate 21. The etching barrier layer 22 includes a silicon layer, and the sacrificial layer 23 includes an oxide layer. The sacrificial layer 23 includes plasma enhanced-tetra ethyl ortho silicate (PE-TEOS), borophosphosilicate glass (BPSG), phosphosilicate glass (PSG), and undoped silicate glass (USG), and has a thickness of approximately 25,000 Å. The sacrificial layer 23 will be removed by a full dip out process in a subsequent process.

After the sacrificial layer 23 is selectively etched, an etching process is temporarily stopped over the etching barrier layer 22. The etching barrier layer 22 is selectively etched to expose a portion of the substrate 21, thereby forming trenches 24. The trenches 24 are storage node contact plug target regions. The trenches 24 for cylindrical storage nodes are formed in a zig-zag pattern, as shown in FIG. 4A, such that the trenches 24 may be applied to highly integrated DRAMs under 60 nm.

Figure 4A:
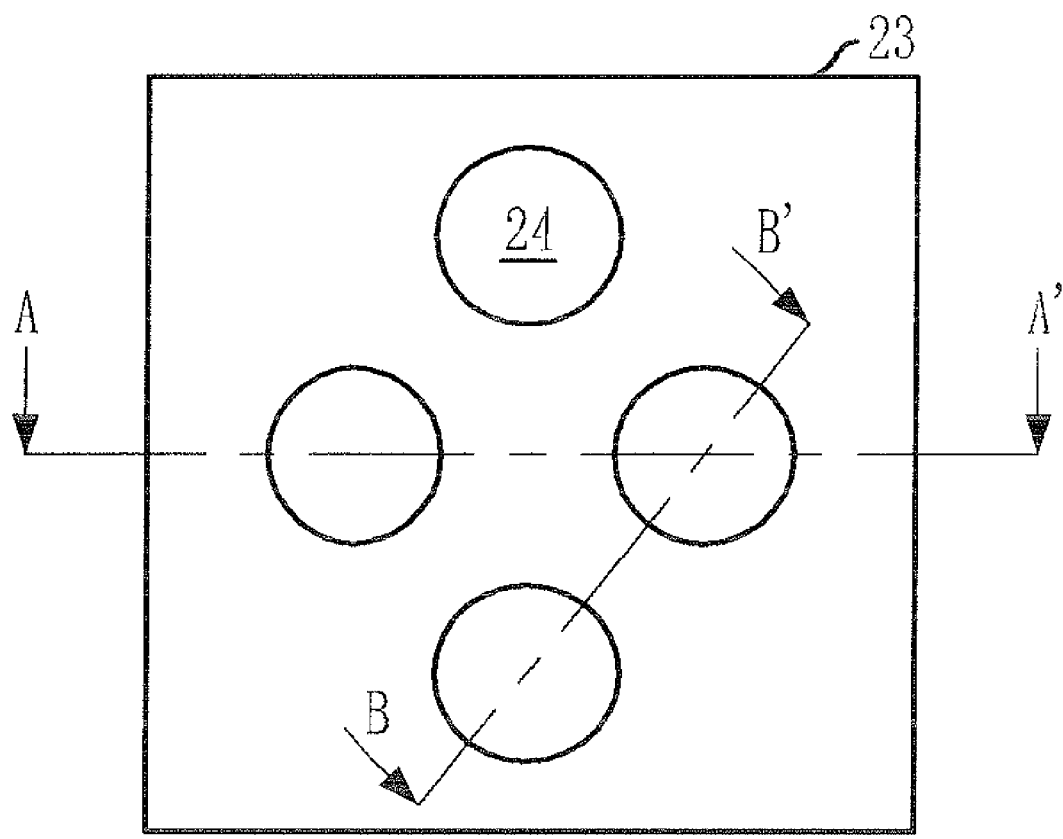
FIG. 4A illustrates a plan view of trenches for a cylindrical storage node target region.

FIG. 4A illustrates a plan view of trenches for the cylindrical storage node. A plurality of the trenches 24 are formed in the sacrificial layer 23 in a zig-zag pattern. The arrangement in the zig-zag pattern of the trenches 24 includes the first region along the line A-A' and the second region along the line B-B' to exist.

Figure 3B:
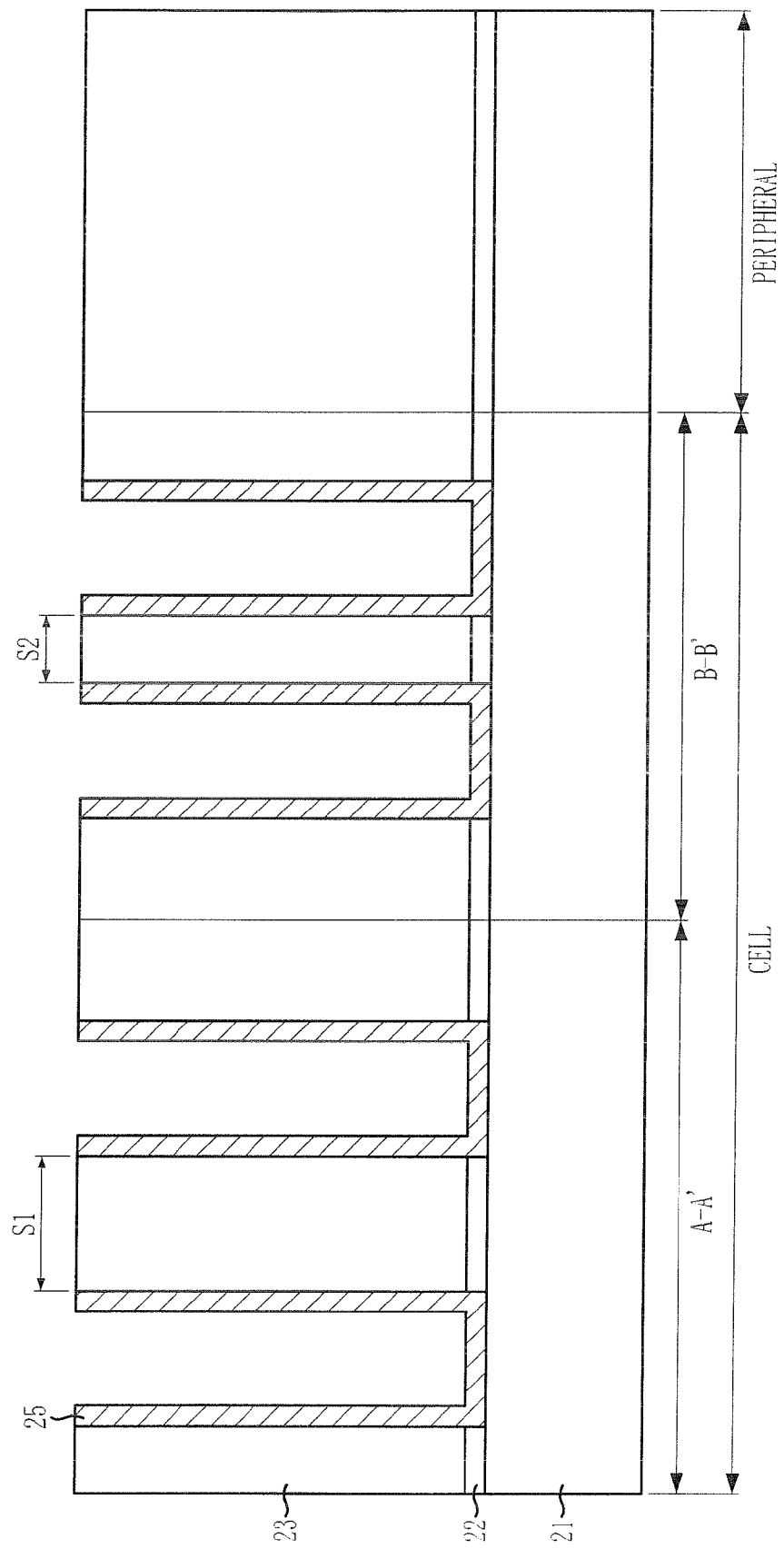

As shown in FIG. 3B, a conductive layer used for the storage node 25 is formed over a first resultant structure including the trenches 24. The conductive layer is isolated by a chemical mechanical polishing (CMP) process or a dry etch back process. Thus, the storage node 25 has a cylindrical structure having inner and outer walls. The outer wall contacts the sacrificial layer 23 and the etching barrier layer 22, and the inner wall is exposed to an exterior of the storage node 25. The storage node 25 is referred to as a bottom electrode.

Preferably, the conductive layer used for the storage node 25 is formed to have a thickness ranging from approximately 100 Å to approximately 400 Å. The conductive layer for the storage node 25 includes a metallic material such as TiN, ruthenium (Ru), ruthenium oxide ($RuO_2$), tantalum nitride TaN, tungsten W, tungsten nitride (WN), iridium (Ir), iridium oxide (IrO$_2$), platinum (Pt) or a combination thereof. The conductive layer may be formed by a chemical vapor deposition (CVD) method, or an atomic layer deposition (ALD) method. In addition, the conductive layer may be formed by a pulsed-CVD (PCVD) method, a sequential flow deposition (SFD) method, or a modified ALD (MALD) method, to which the CVD method, or the ALD method is partially applied. A wide interval S1 is formed between neighboring storage nodes in the first region along the line A-A'. A narrow interval S2 is formed between neighboring storage nodes in the second region along the line B-B'.

Figure 4B:
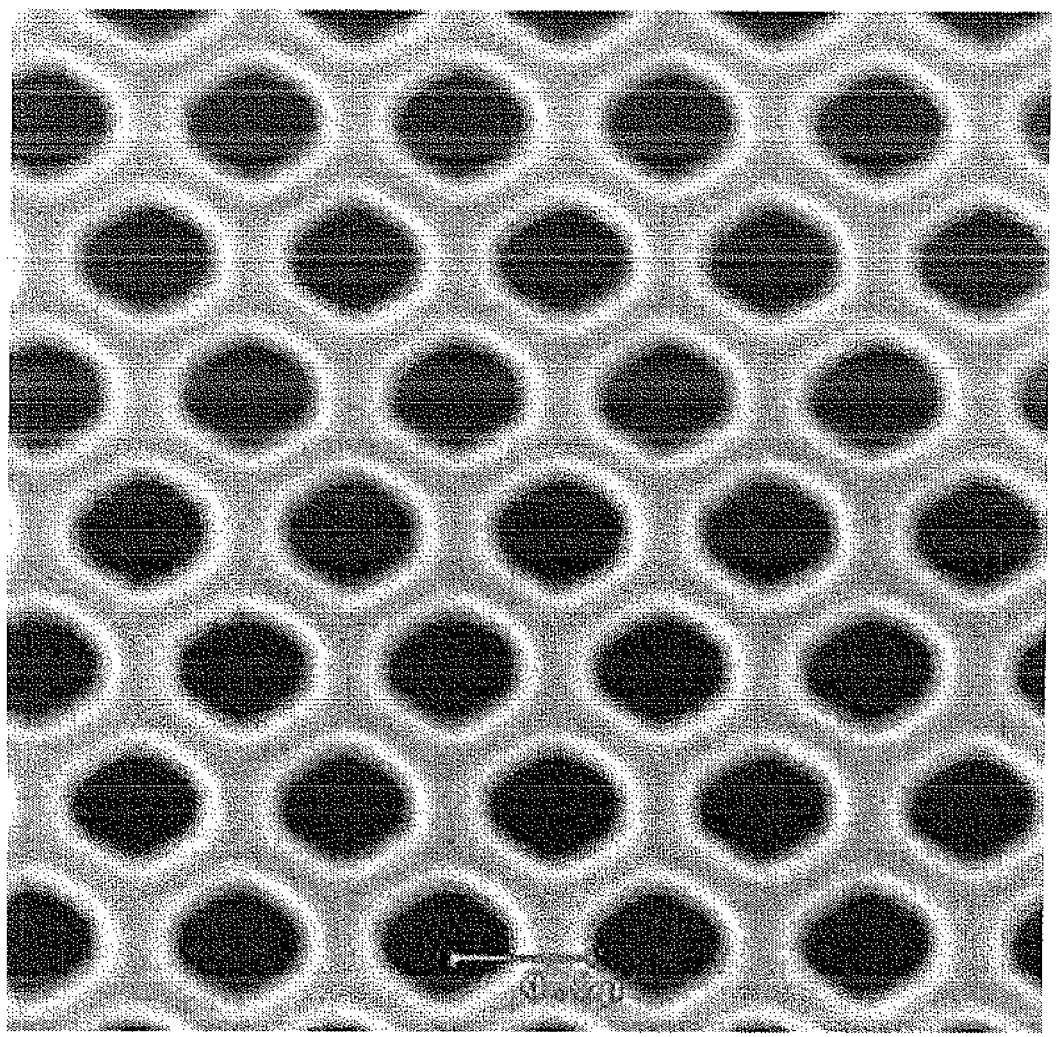
FIG. 4B illustrates a micrographic view after a storage node is isolated.

Furthermore, referring to FIG. 4B, a micrographic view after a storage node is isolated, in which the storage nodes are arranged in a zig-zag pattern. Thus, wide intervals and narrow intervals are recognizable.

As shown in FIG. 3C, a portion of the sacrificial layer 23 is etched by a wet etching process. The wet etching process is performed by dipping the sacrificial layer 23 into a diluted HF solution, or a buffered oxide etchant (BOE) solution including a mixed solution of NH$_4$F and HF. Such a wet etch process is referred to as a wet dip out process.

The portion of the sacrificial layer 23 formed between the storage nodes 25 is etched by the wet dip out process as described above. According to the first embodiment of the present invention, the sacrificial layer 23 is partially etched with respect to a target T (in the cell region) having a thickness ranging from approximately 2,000 Å to approximately 20,000 Å (i.e., corresponding to approximately 8% to approximately 80% of an initial thickness of the sacrificial layer 23 of approximately 25,000 Å). This partial etching process is referred to as a partial wet dip out process. Since the sacrificial layer 23 is removed using the target T having a thickness more than approximately 2,000 Å, a process time for the full dip out process to remove a remaining portion of the sacrificial layer 23 can be reduced. In addition, when the sacrificial layer 23 is removed using the target T having a thickness of more than approximately 2,000 Å, a thickness of a bottom surface of an amorphous carbon layer can be controlled to a thickness of approximately 150 Å or less. The amorphous carbon layer is formed over the first region along the line A-A' in a subsequent deposition process.

An upper portion 25A of the storage node 25 is exposed by the partial wet dip out process, and a remaining portion of the storage node 25 is supported by a first etched sacrificial layer 23A.

A portion of the sacrificial layer 23 is removed in the peripheral region by the partial wet dip out process, so that a second etched sacrificial layer 23B remains. The second etched sacrificial layer 23B remaining in the peripheral region may be thicker than the first etched sacrificial layer 23A remaining in the cell region. This is because the partial wet dip out process is more widely performed in the peripheral region than the cell region, so that an etching rate is lower in the peripheral region than in the cell region.

Figure 3D:
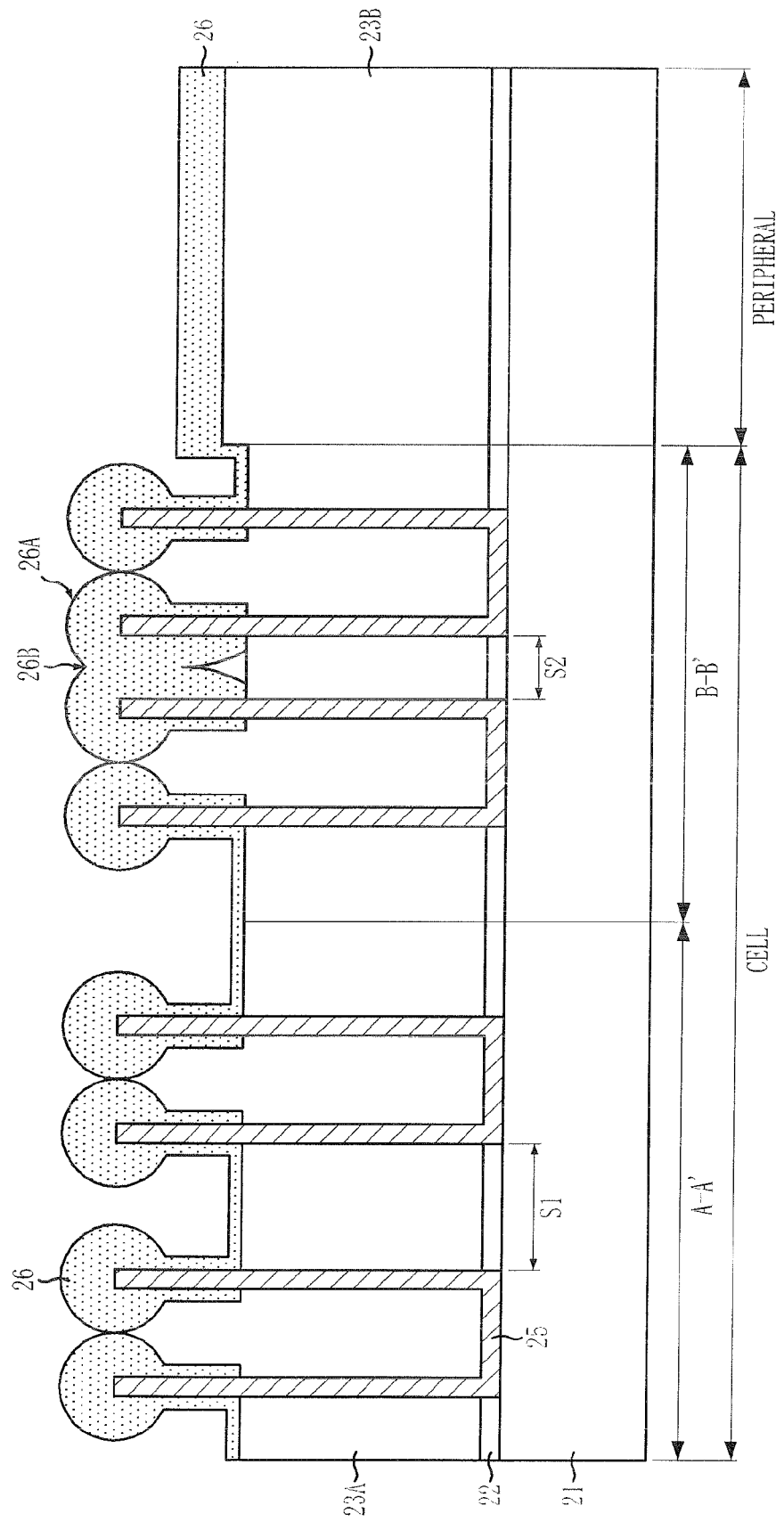

As shown in FIG. 3D, a carbon-based layer 26 is formed over a second resultant structure including the exposed upper portion 25A of the storage node 25. The carbon-based layer 26 includes an amorphous carbon. The amorphous carbon layer 26 has a thickness ranging from approximately 500 Å to approximately 1,500 Å.

The amorphous carbon layer 26 is formed having a low step-coverage of approximately 20% or less. The amorphous carbon layer 26 is formed by a plasma enhanced chemical-vapor deposition (PECVD) method.

When the amorphous carbon layer 26 is formed as described above, different profiles are expressed in the portion S2 having a narrower interval between neighboring storage nodes and the portion S1 having a wider interval S1 between neighboring storage nodes. Specifically, the amorphous carbon layer 26 is repeatedly formed in the portion S2 so that the amorphous carbon layer 26 becomes thicker while partially filling in a space formed between neighboring storage nodes 25. In contrast, the amorphous carbon layer 26 is shallowly formed in the portion S1 without filling in a space between neighboring storage nodes 25. Preferably, if the PECVD method is employed, the amorphous carbon layer 26 is formed in an overhang structure 26A. The over hangs 26A overlap with each other in the portion S2, so that the amorphous carbon layer 26 becomes thicker. A reference numeral 26B represents the overlap portion.

Preferably, forming the amorphous carbon layer 26 is performed in a chamber at a radio frequency (RF) power ranging from approximately 100 W to approximately 1 kW, at a temperature ranging from approximately 200° C. to approximately 600° C. and at a pressure ranging from approximately 1 Torr to approximately 10 Torr. A carbon source includes cyclopropane (C$_3$H$_6$) or C$_9$H$_{12}$. The carbon source is injected into the chamber by controlling an amount of the carbon source from approximately 0.1 slm to approximately 50 slm. In order to stabilize or improve deposition properties (e.g., deposition rate and a uniformity of a deposition thickness), an inert gas atmosphere is created or a carrier gas is injected in an amount ranging from approximately 0.1 slm to approximately 50 slm. The amorphous carbon layer is formed with a poor step-coverage. The inert gas includes helium (He) gas or argon (Ar) gas.

Figure 4C:
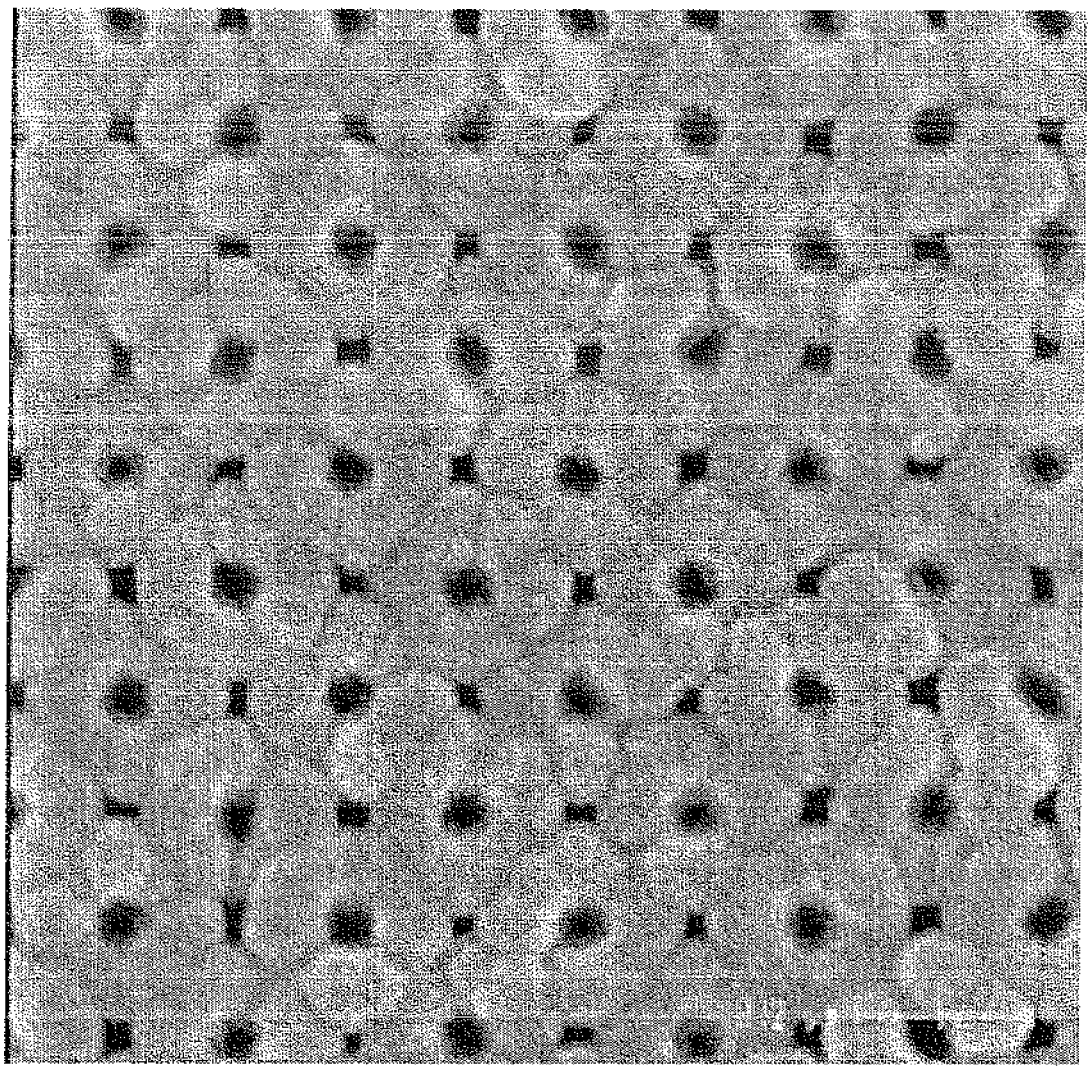
FIG. 4C illustrates a micrographic view after forming an amorphous carbon layer according to a process shown in FIG. 3D.

FIG. 4C illustrates a micrographic view after forming an amorphous carbon layer according to a process shown in FIG. 3D. The amorphous carbon layer is formed thicker in the portion having the narrower interval between neighboring storage nodes than in the portion having the wider interval between neighboring storage nodes.

Since a portion of the sacrificial layer 23 is removed by the partial wet dip out process so that the exposed upper portion of the storage node 25 has a height of approximately 2,000 Å or more, the thickness of the amorphous carbon layer 26 formed on the bottom surface of the portion S1 having the wider interval between the neighboring storage nodes can be controlled to approximately 150 Å or less (preferably, approximately 120 Å). When the thickness of the bottom surface is as thin as described above, an etching target may be reduced in a subsequent spacer etching process, which will be described later.

In addition, since an interval depth of the storage node 25 is relatively deep, the over hangs are combined with each other before the carbon source is provided at the internal bottom surface of the storage node 25. Accordingly, the amorphous carbon layer 26 is not formed inside of the storage node 25 under a certain height of the storage node 25.

Figure 3E:
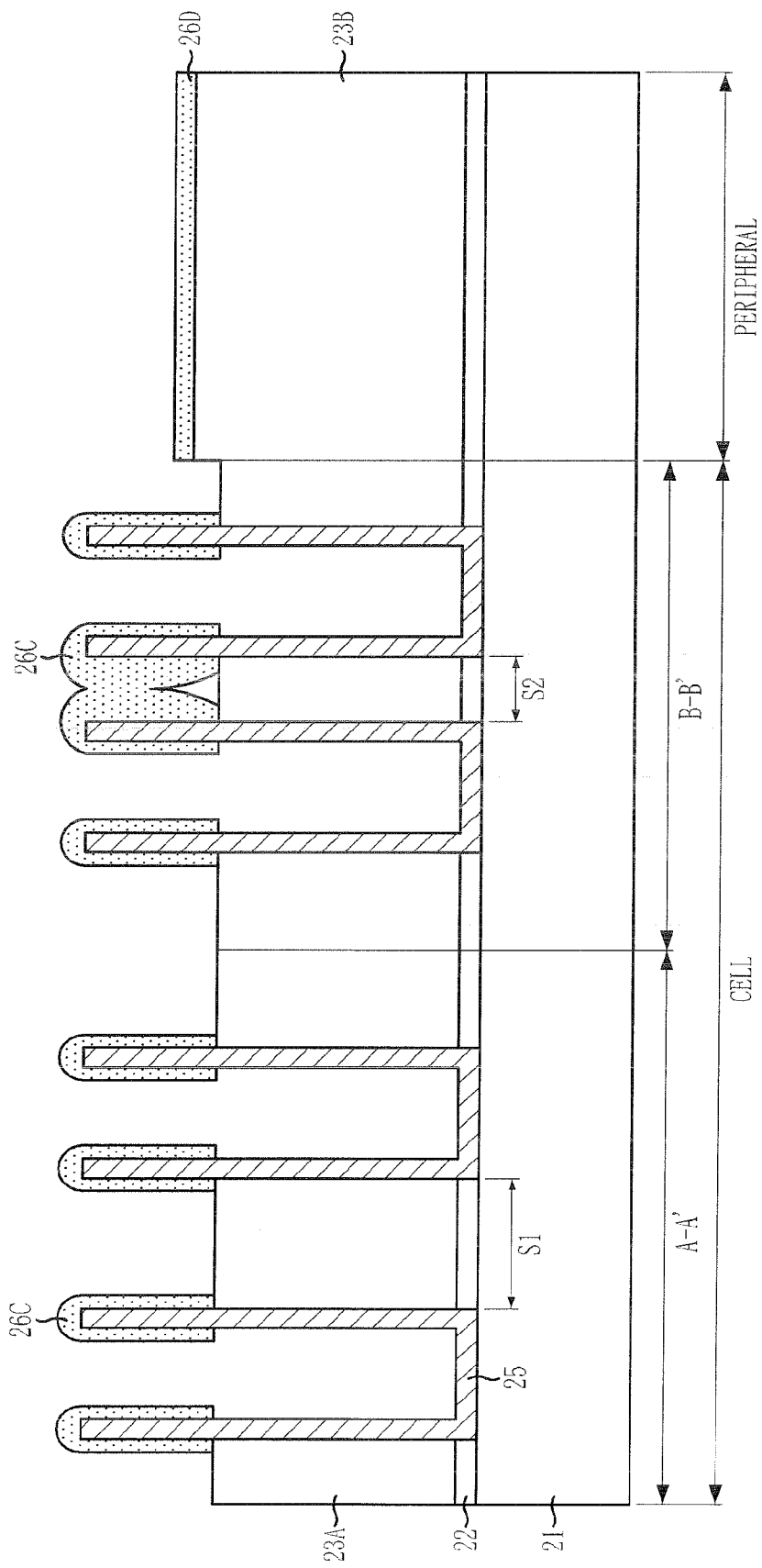
Figure 4D:
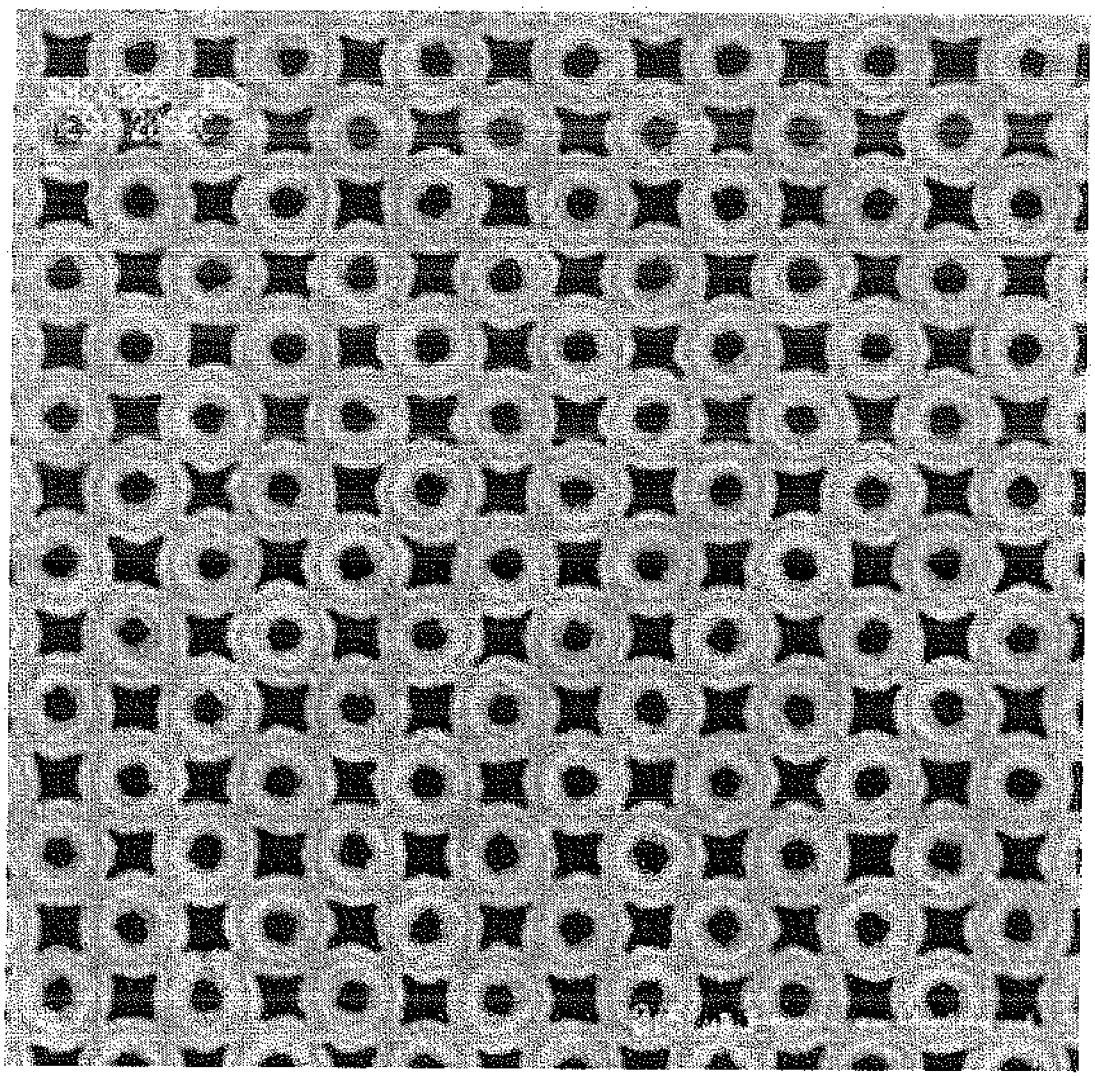
FIG. 4D illustrates a micrographic view of a resultant structure after a spacer etching process is performed according to the process step shown in FIG. 3E.

As shown in FIG. 3E, the amorphous carbon layer 26 is spacer-etched by a blanket etch-back process, thereby forming a supporter 26C having a mesh form as shown in FIG. 4D. The mesh supporter 26C is formed because the step-coverage of the amorphous carbon layer 26 formed by a plasma chemical-vapor deposition (PCVD) process is less than approximately 20%.

The mesh supporter 26C simultaneously supports the exposed upper portions of the neighboring storage nodes 25.

Hereinafter, a method for forming the mesh supporter 26C will be described in detail.

The amorphous carbon layer 26 in the second region along the line B-B' has a thickness ranging from approximately 500 Å to approximately 1,500 Å between neighboring storage nodes. The amorphous carbon layer 26 in the first region along the line A-A' has a thickness ranging from approximately 200 Å or less on the bottom surface between neighboring storage nodes. When a target etching process is performed by controlling an etch time through a blanket etch-back process after the amorphous carbon layer 26 is formed, an amorphous carbon layer 26D in the second region along the line B-B' remains since the amorphous carbon layer 26 in the second region is thickly formed. The amorphous carbon layer 26 in the first region along the line A-A', in which a portion of the sacrificial layer 23 is removed by the partial wet dip out process, is easily removed since the amorphous carbon layer 26 in the first region is thinly formed on the bottom surface between storage nodes.

FIG. 4D illustrates a micrographic view of a third resultant structure after a spacer etching process is performed according to the process shown in FIG. 3E.

As shown in FIG. 4D, since amorphous supporters are linked with each other in a portion having a narrow interval between neighboring storage nodes, the amorphous supporters supporting upper portions of the storage nodes form a mesh structure in which the supporters are linked with each other. The mesh structure is formed even though a bottom surface in a portion having a wide interval between neighboring storage nodes is exposed.

As shown in FIG. 3E, an amorphous carbon layer 26D remains on a surface of the peripheral region. Since an initial amorphous carbon layer 26 is formed thicker in the peripheral region than on the bottom surface of the first region along the line A-A', the amorphous carbon layer 26 remains in the peripheral region after the spacer etching process is performed. The amorphous carbon layer 26 on the bottom surface of the first region along the line A-A' is formed to be thinner than in a flat portion of the peripheral region due to the over hangs.

Figure 3F:
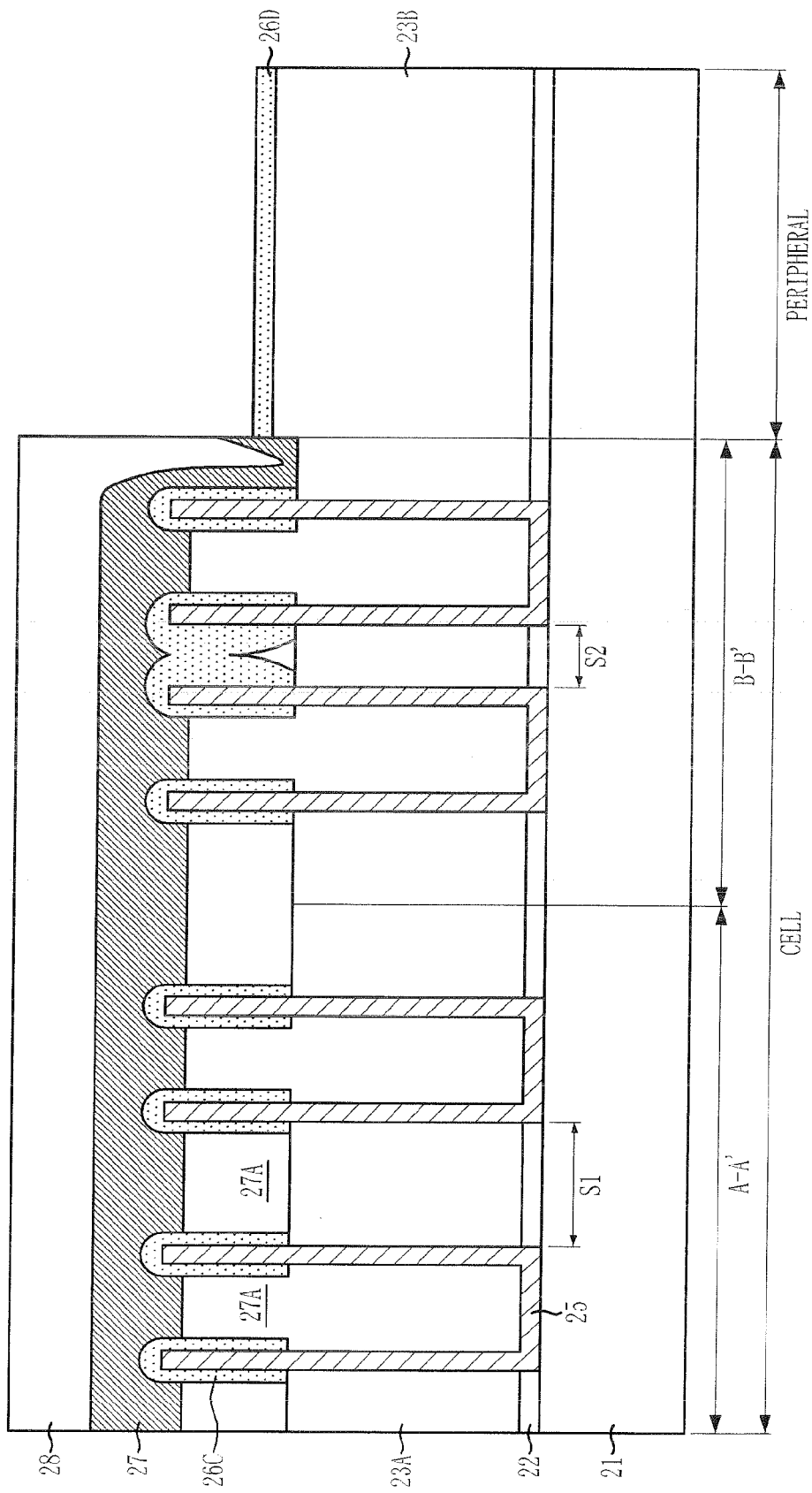

As shown in FIG. 3F, a capping layer 27 is formed on the third resultant structure. The capping layer 27 covers the upper portions of the storage nodes 25. The capping layer 27 includes an undoped silicate glass (USG) oxide layer and has a thickness ranging from approximately 500 Å to approximately 3,000 Å. In other words, the capping layer 27 covers the upper portion of the storage node 25, preferably, the upper portion of the supporter 26C, instead of completely filling the space between the storage nodes 25. Accordingly, after the capping layer 27 is formed, a space 27A is formed under the supporter 26C. The capping layer 27 prevents the supporter 26C under the capping layer 27 from being damaged and the inside of the storage node 25 from being damaged in a subsequent process of removing a photoresist pattern.

A photoresist pattern 28 is formed on the capping layer 27. The photoresist pattern 28 is referred to as a peripheral open mask (POM) to protect the cell region and expose the capping layer 27 in the peripheral region.

The exposed capping layer 27 in the peripheral region is removed by a dry etching process, so that the capping layer 27 remains on an upper portion of the cell region.

As shown in FIG. 3G, the photoresist pattern 28 in the cell region is removed by the dry etching process instead of an ashing treatment. The amorphous carbon layer 26D remaining in the peripheral region is removed during the dry etching process for removing the photoresist pattern 28. Since the photoresist pattern 28 and the amorphous carbon layer 26D include organic material, the photoresist pattern 28 and the amorphous carbon layer 26D are removed. The dry etching process for removing the photoresist pattern 28 is performed using oxygen plasma.

Since the supporter 26C in the cell region is covered with the capping layer 27, the supporter 26C remains after the dry etching process is performed on the photoresist pattern 28.

As shown in FIG. 3H, a fourth resultant structure is dipped into a diluted HF solution, or a buffered oxide etchant (BOE) solution, so that the capping layer 27 in the cell region, the sacrificial layer 23A between the storage nodes 25 and the sacrificial layer 23B in the peripheral region are removed since the capping layer and the sacrificial layers 23A and 23B are composed of oxide material. The above process is referred to as a full dip out process. After the full dip out process is performed, a dry process is performed.

Figure 4E:
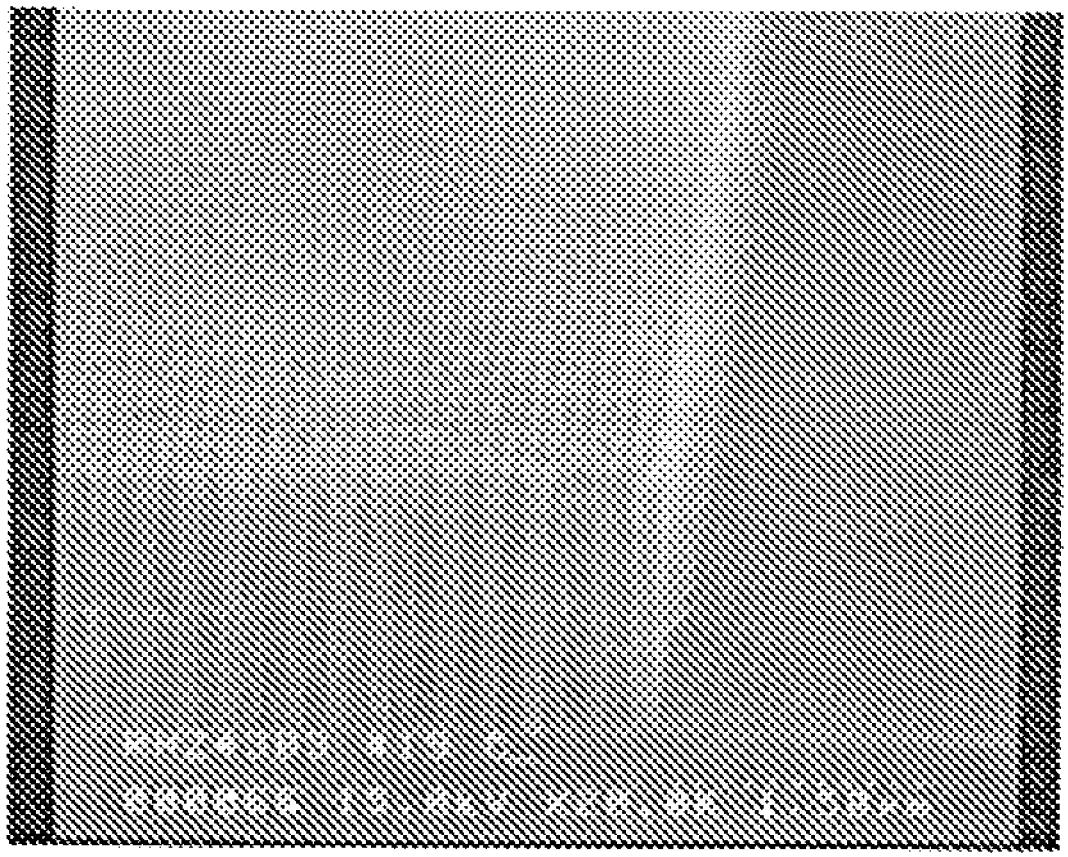
FIG. 4E illustrates a micrographic view of a resultant structure after a full dip out process is performed.

FIG. 4E illustrates a micrographic view of a fifth resultant structure after a full dip out process is performed.

It can be recognized from the micrographic view in FIG. 4E that the storage node 25 does not lean toward neighboring storage nodes even when the full dip out process is performed since the supporters support neighboring storage nodes.

As a result, even if the aspect ratio of the storage nodes 25 exceeds 14:1 as the height of the capacitor is higher than a typical height of a capacitor, it is possible to prevent a leaning phenomenon of the storage nodes by the supporters having the mesh structure. As described above, the leaning phenomenon is caused by water marks remaining between neighboring storage nodes in the wet etching process (i.e., the full dip out process) and the drying process. Furthermore, since the remaining etching barrier layer 22 supports circumferences of the bottom surface of the storage nodes 25, the etching barrier layer 22 partially prevents the leaning phenomenon of the storages nodes 25.

As shown in FIG. 3I, a final process for fabricating the storage nodes 25 having a cylindrical structure is an ashing treatment using a chamber enabling oxygen ($O_2$) plasma treatment. The supporters 26C are removed by performing the ashing treatment. Thus, the storage nodes 25 having cylindrical structures are formed without the occurrence of a leaning phenomenon.

Since oxygen plasma may be used in a conventional photoresist chamber, the conventional photoresist chamber may be used for the ashing treatment.

When the photoresist pattern is removed using the oxygen plasma, the ashing treatment is performed at a RF power ranging from approximately 200 W to approximately 2 kW, at a flow rate of oxygen plasma ranging from approximately 10 sccm to approximately 10 slm, at a temperature ranging from approximately 200° C. to approximately 500° C., and at a pressure ranging from approximately 1 Torr to approximately 10 Torr for approximately 30 seconds to approximately 300 seconds in a chamber.

Figure 4F:
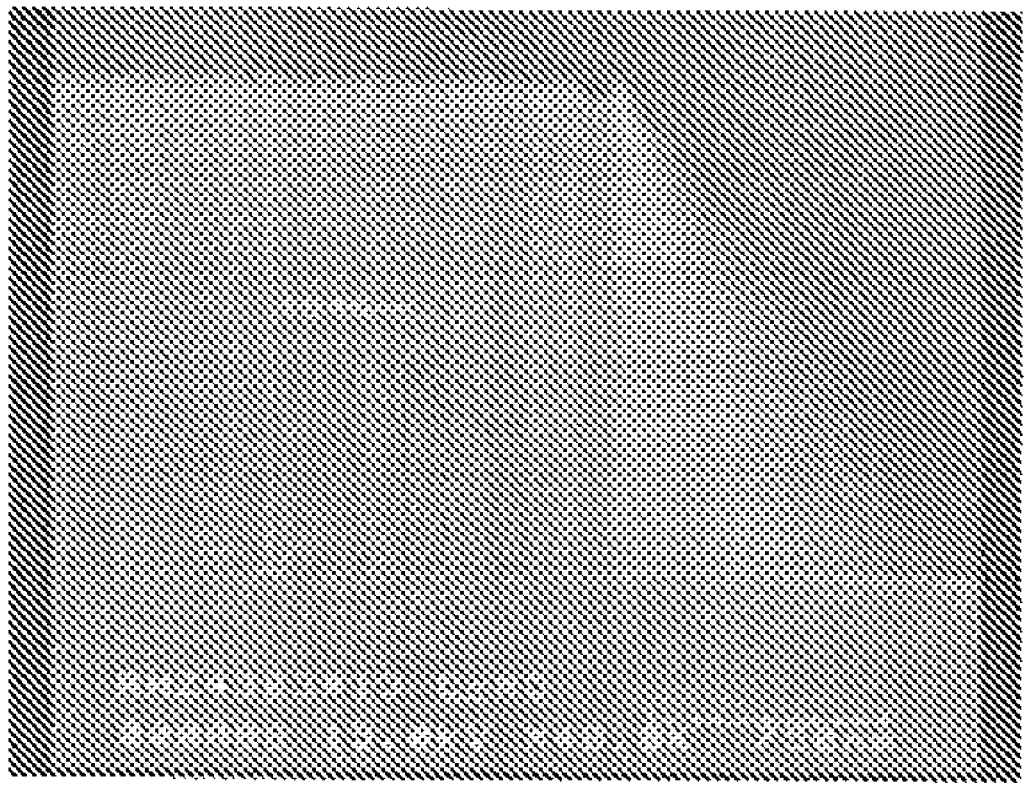
FIG. 4F illustrates a micrographic view of a resultant structure after an ashing treatment is performed.

FIG. 4F illustrates a micrographic view of a sixth resultant structure after the ashing treatment is performed. As shown in FIG. 4F, the leaning phenomenon of the storage nodes does not occur even though the ashing treatment is performed.

Figure 4G:
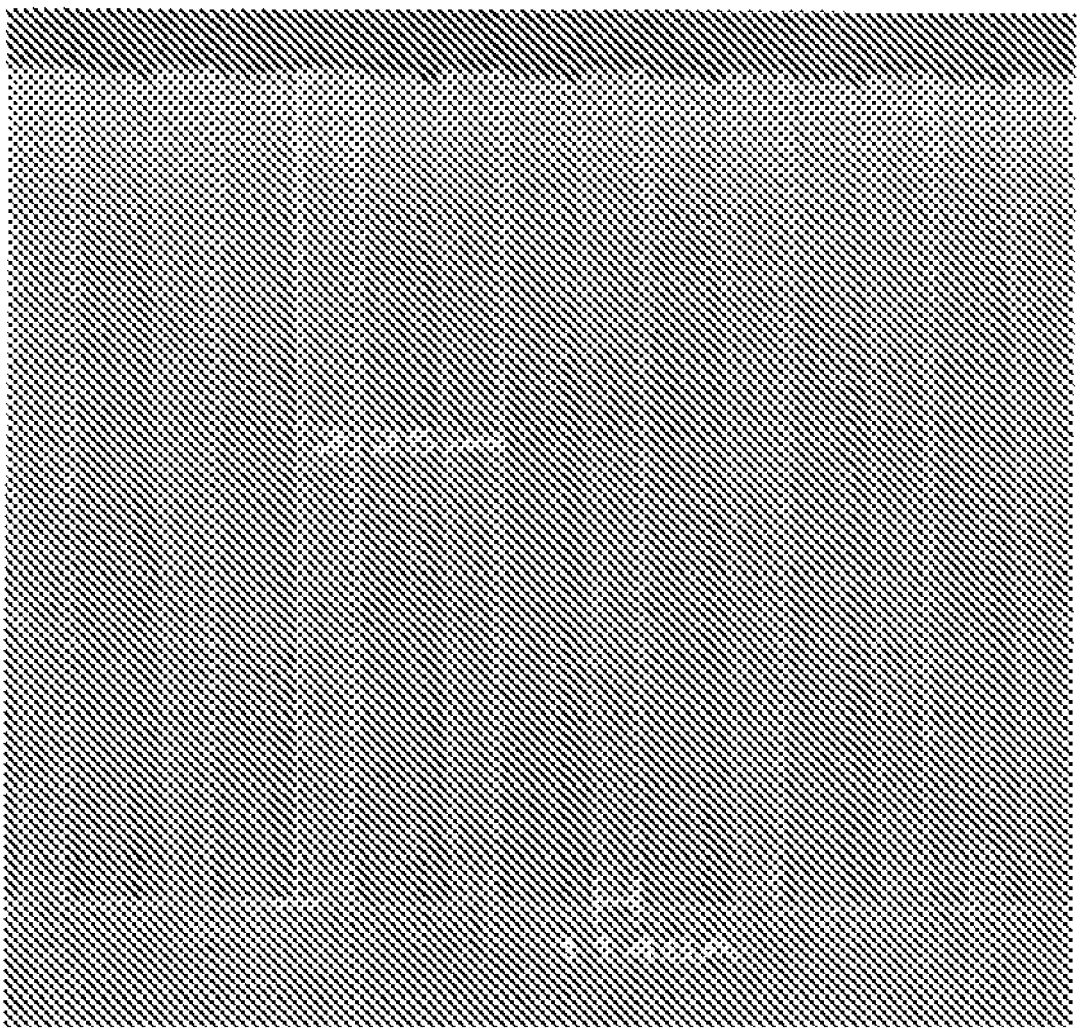
FIG. 4G illustrates a micrographic view of an internal section of a final storage node according to the first embodiment of the present invention.
Figure 4H:
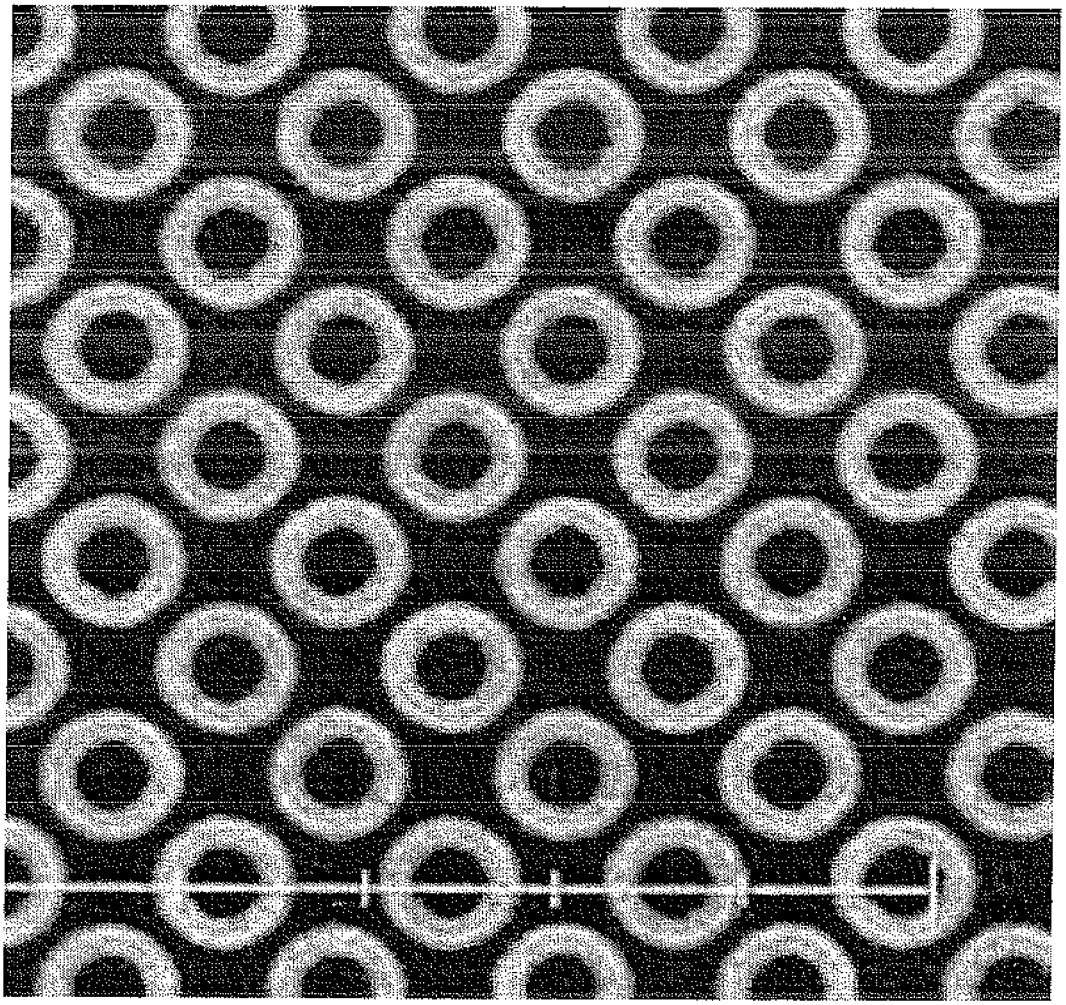
FIG. 4H illustrates a micrographic view of a plan view of a final storage node according to the first embodiment of the present invention.

FIG. 4G illustrates a micrographic view of an internal section of a final storage node according to the first embodiment of the present invention. FIG. 4H illustrates a plan view of final storage nodes according to the first embodiment of the present invention.

FIGS. 4G and 4H illustrate an aspect ratio of a storage node that exceeds 20:1. As shown, non-leaning storage nodes are formed, such that a bridge is not formed between neighboring storage nodes.

FIGS. 5A to 5D illustrate cross-sectional views of a method for fabricating a capacitor with a cylindrical storage node according to a second embodiment of the present invention.

According to the second embodiment, forming a capping layer is directly performed without performing the spacer etching process after forming the amorphous carbon layer as shown in FIG. 3D. In other words, according to the second embodiment of the present invention, the following processes are performed without forming the supporters having the mesh structure.

Hereinafter, the operational procedure and reference numbers for forming of the amorphous carbon layer are identical to those of the first embodiment. Thus, details thereof will be omitted to avoid redundancy.

Figure 5A:
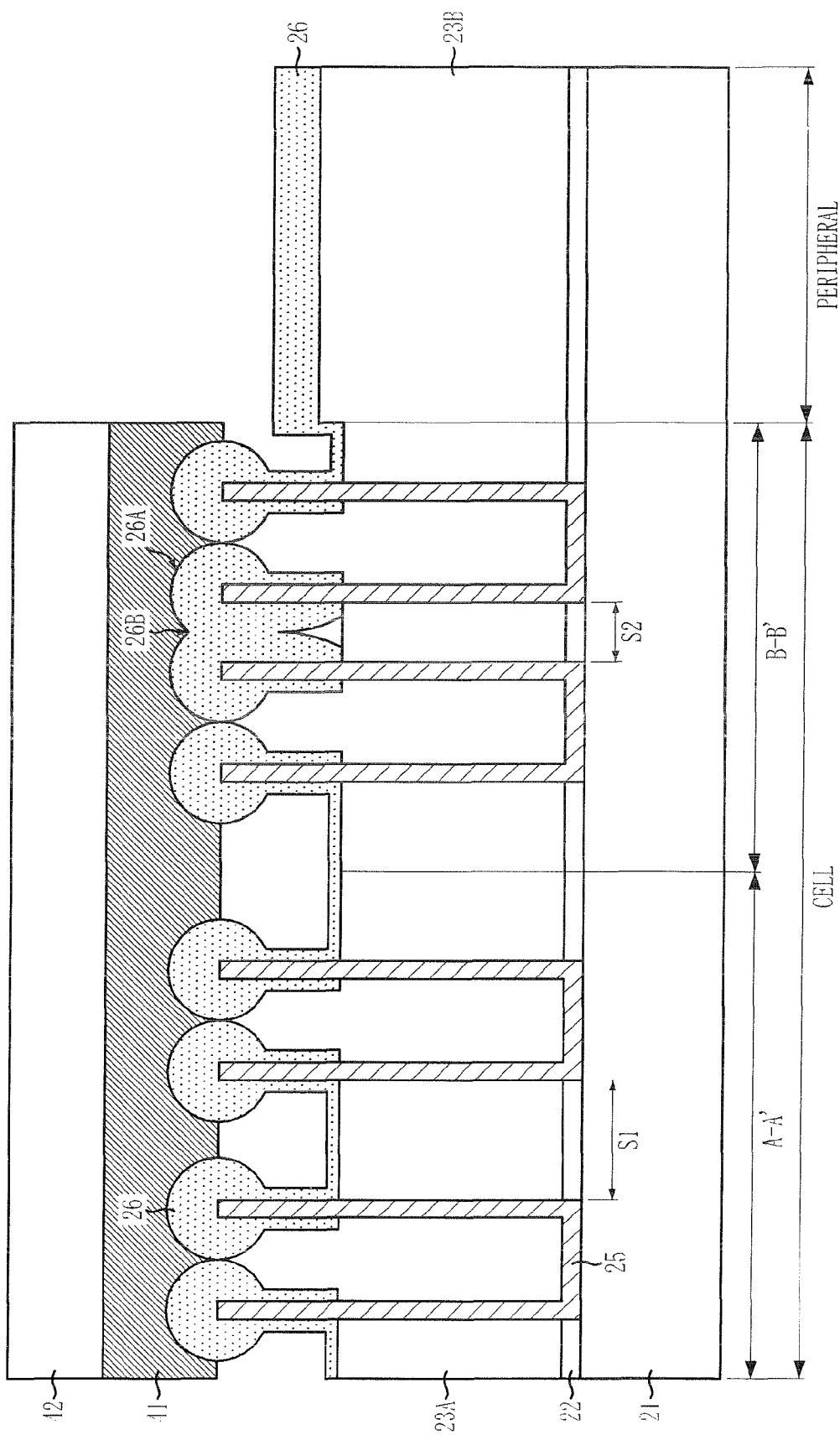

As shown in FIG. 5A, a capping layer 41 is directly formed after the amorphous carbon layer 26 is formed. The capping layer 41 includes an undoped silicate glass (USG) oxide layer having a thickness ranging from approximately 500 Å to approximately 3,000 Å over the upper portion of the storage node 25. In other words, the capping layer 41 covers the upper portion of the storage node 25, preferably, the upper portion of the amorphous carbon layer 26, instead of filling the space between the storage nodes 25. Accordingly, after the capping layer 41 is formed, a space is created under the amorphous carbon layer 26.

The capping layer 41 prevents the amorphous carbon layer 26 under a photoresist pattern 42 from being damaged and prevents the inside of the storage node 25 from being damaged in a subsequent process of removing the photoresist pattern 42.

The photoresist pattern 42 is formed on the capping layer 41. The photoresist pattern 42 is referred to as a peripheral open mask (POM) to protect the cell region and expose the capping layer 41 in the peripheral region.

The exposed capping layer 41 of the peripheral region is removed by a dry etching process, such that the capping layer 41 remains on the upper portion of the cell region.

Figure 5B:
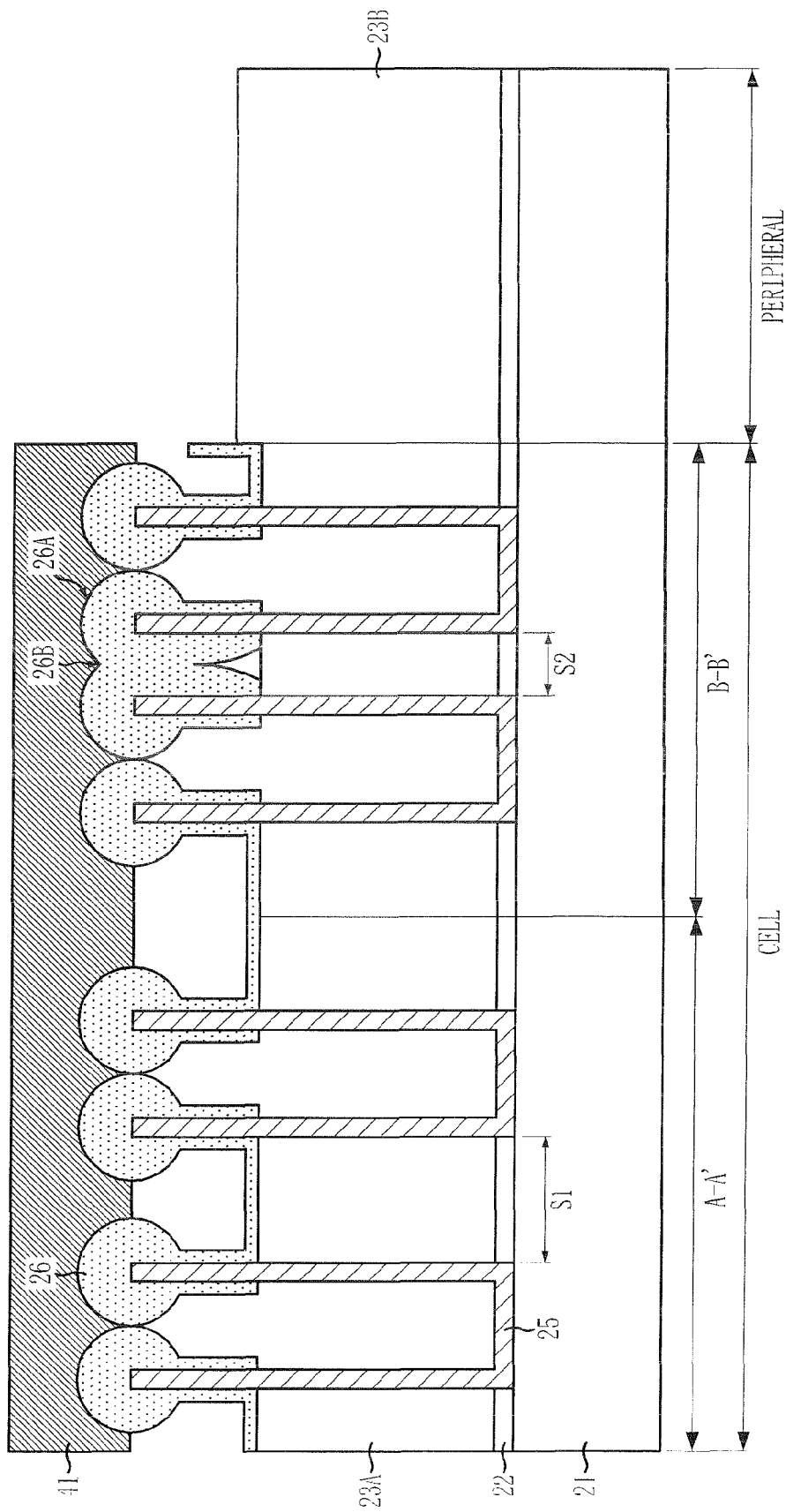

As shown in FIG. 5B, the photoresist pattern 42 covering the cell region is removed by a dry etching process instead of an ashing treatment. The amorphous carbon layer 26 remaining in the peripheral region is removed during the dry etching process for removing the photoresist pattern 42. Since the photoresist pattern 42 and the amorphous carbon layer 26 include organic material, the photoresist pattern 42 and the amorphous carbon layer 26 are simultaneously removed. The dry etching process for the photoresist pattern 42 is performed using oxygen plasma.

Since the amorphous carbon layer 26 in the cell region is covered with the capping layer 41, the amorphous carbon layer 26 in the cell region remains when the photoresist pattern 42 is removed by the dry etching process.

Figure 5C:
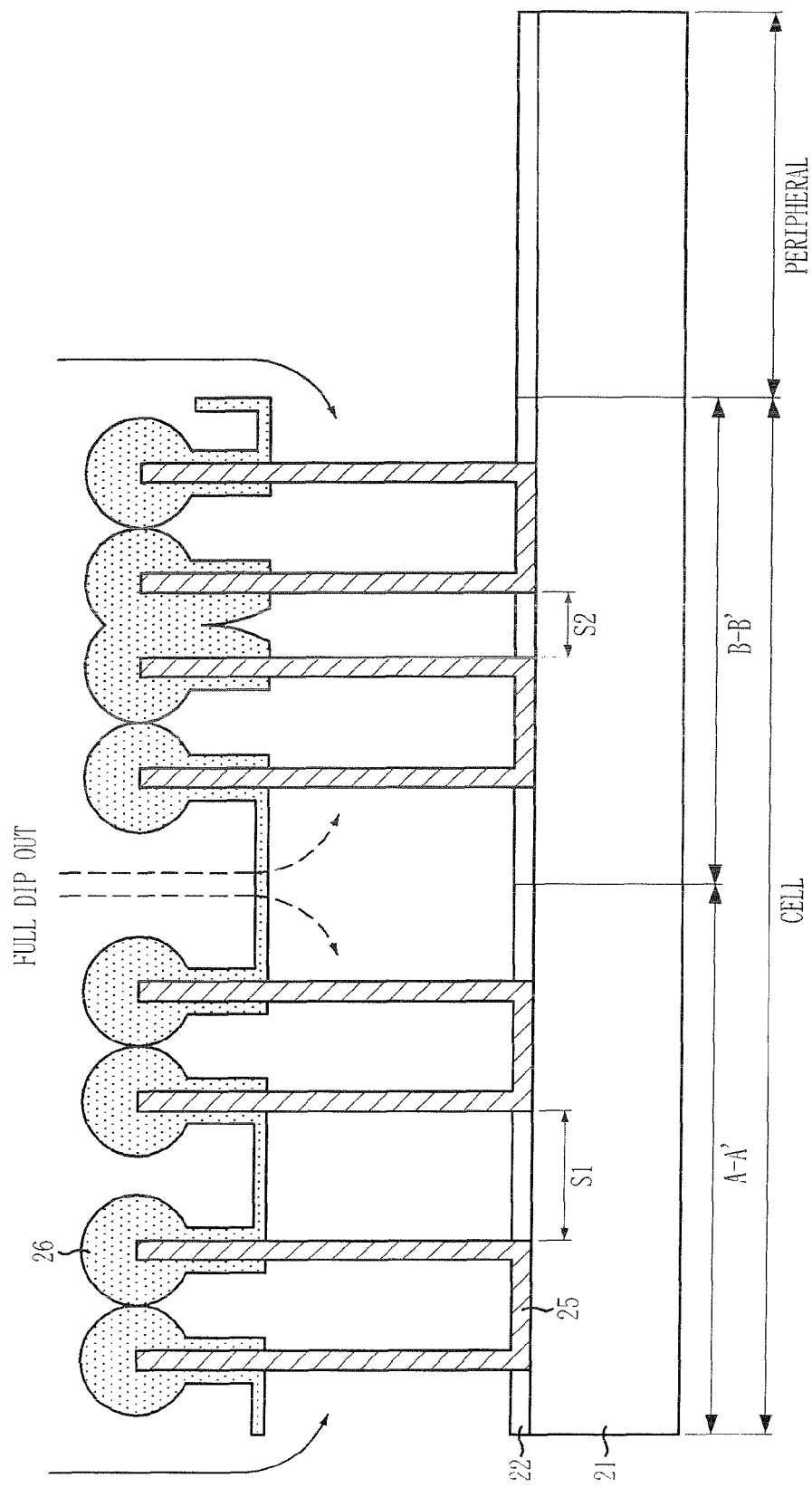

As shown in FIG. 5C, a first resultant structure is dipped into a diluted HF solution or a buffered oxide etchant (BOE) solution, so that the sacrificial layers 23A and 23B remaining between the storage nodes 25 and in the peripheral region, respectively, are removed. The above process is referred to as a full dip out process.

Since the capping layer 41 and the sacrificial layers 23A and 23B include oxide material, the capping layer 41 and the sacrificial layers 23A and 23B are removed by the full dip out process. After the full dip out process is performed, a drying process is performed.

The storage node 25 does not lean toward neighboring storage nodes even when the full dip out process is performed since the amorphous carbon layer 26 supports the upper portion of the storage node 25. In addition, the amorphous carbon layer 26 remains without being etched after the full dip out process is performed.

As a result, even if the aspect ratio of the storage node exceeds 14:1, it is possible to prevent a leaning phenomenon of storage nodes by the amorphous carbon layer 26. As discussed above, the leaning phenomenon is caused by water marks remaining between neighboring storage nodes in the wet etching process (i.e., the full dip out process) and the drying process. In addition, since the remaining etching barrier layer 22 supports the circumference of the bottom surface of the storage node, the etching barrier layer 22 partially prevents the occurrence of the leaning phenomenon.

As shown in FIG. 5D, a final process for fabricating the storage node 25 having a cylindrical structure is an ashing treatment using a chamber enabling oxygen plasma treatment. The amorphous carbon layer is removed by performing the ashing treatment to form storage nodes 25 having cylindrical structures.

When the photoresist pattern 42 is removed using oxygen plasma, the ashing treatment is performed at a RF power ranging from approximately 200 W to approximately 2 kW, at a flow rate of oxygen plasma ranging from approximately 10 sccm to approximately 10 slm, at a temperature ranging from approximately 200° C. to approximately 500° C., and at a pressure ranging from approximately 1 Torr to approximately 10 Torr for approximately 30 seconds to approximately 300 seconds in a chamber.

Since oxygen plasma may be used in a conventional photoresist chamber, the conventional photoresist chamber is used for the ashing treatment.

Figure 6B:
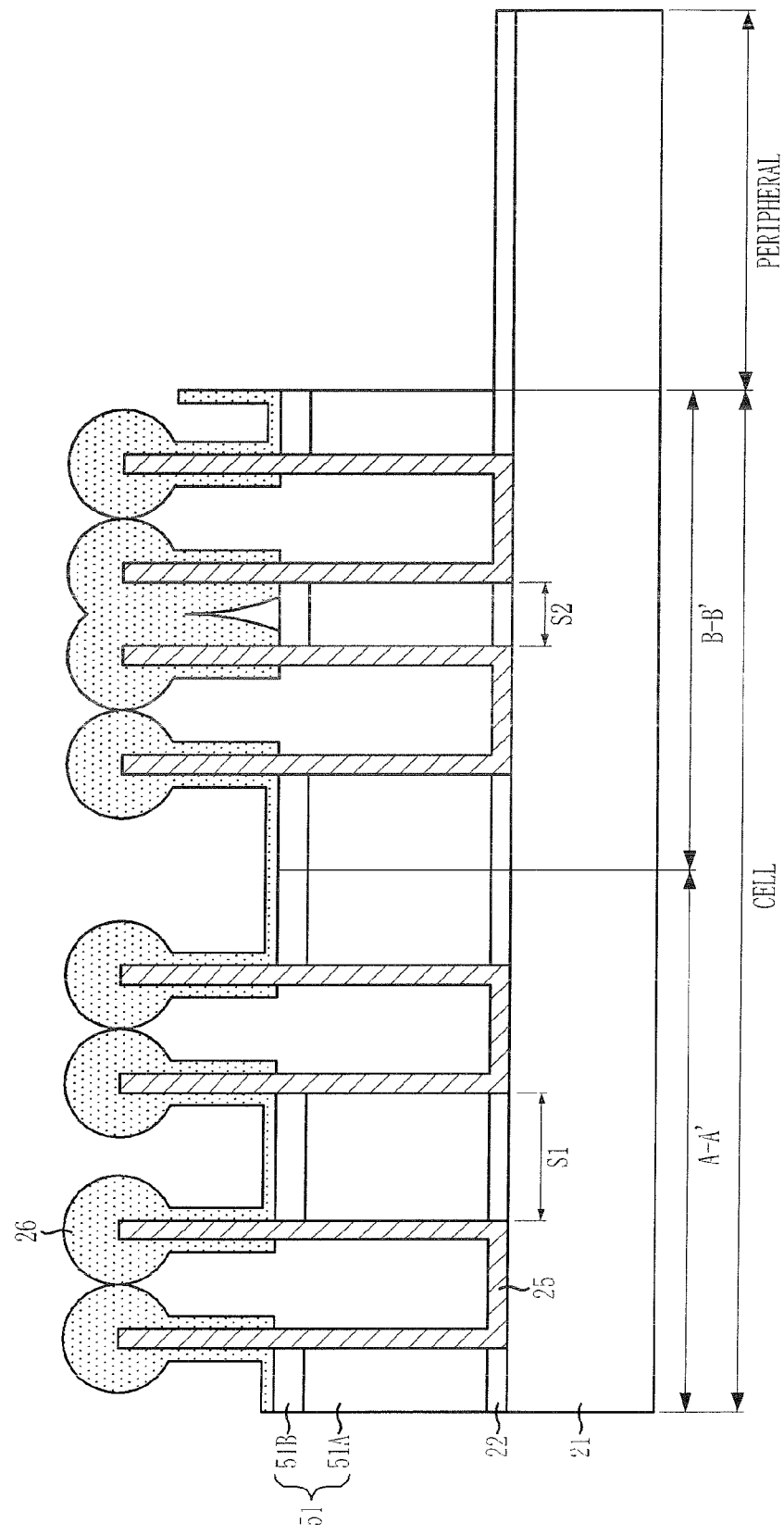
Figure 6D:
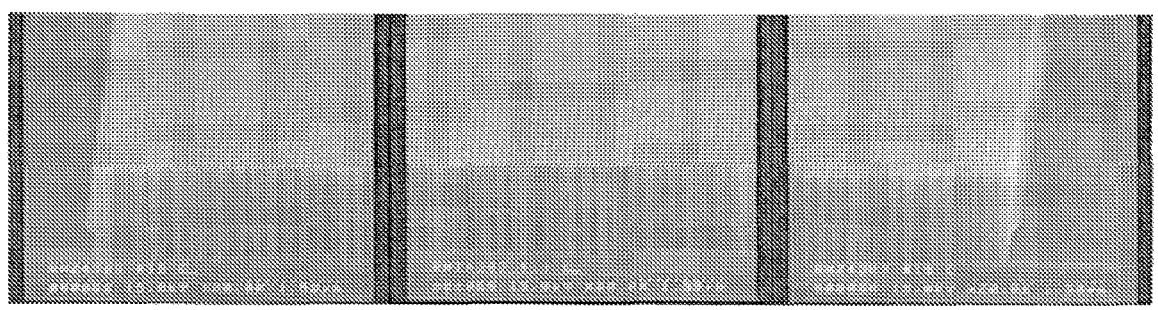
FIG. 6D illustrates a micrographic view of a resultant structure according to the third embodiment of the present invention.

FIG. 6A illustrates a schematic view of a full dip out process according to a third embodiment of the present invention. FIGS. 6B and 6C illustrate cross-sectional views of a method for fabricating a capacitor with a cylindrical storage node according to the third embodiment of the present invention, and FIG. 6D illustrates micrographic views of a resultant structure according to the third embodiment of the present invention.

According to the third embodiment of the present invention, after the capping layer and the amorphous carbon layer 26 in the peripheral region are removed as shown in FIG. 5B without forming an supporter (similar to the second embodiment), the full dip out process shown in FIG. 5C is performed. Thus, the amorphous carbon layer 26 remains on the upper portion of the storage node 25.

As shown in FIG. 6A, when a resultant structure is dipped into a diluted HF solution or a buffered oxide etchant (BOE) solution during a full dip out process, a wet solution infiltrates into a central portion of a cell matrix 100 from four borders of the cell matrix 100. Thus, oxide material remaining in the cell region and the peripheral region is removed.

The sacrificial layers according to the first and second embodiments include a single oxide layer. A sacrificial layer structure according to the third embodiment of the present invention is modified as follows to perform the full dip out process.

As shown in FIG. 6B, a sacrificial structure 51 according to the third embodiment of the present invention is formed by stacking a lower sacrificial layer 51A and an upper sacrificial layer 51B having different wet etching rates. For example, the lower sacrificial layer 51A includes an oxide layer having a relatively fast wet etching rate, and the upper sacrificial layer 51B includes an oxide layer having a wet etching rate that is slower than that of the lower sacrificial layer 51A.

When the diluted HF solution or the BOE solution is employed, the oxide layer having a fast wet etching rate includes PSG, BPSG, or USG, and the oxide layer having a slow wet etching rate includes PE-TEOS. As shown in FIG. 6C, when a sacrificial layer structure having different wet etching rates is used, the wet solution infiltrates into the lower sacrificial layer 51A having a fast wet etching rate during the full dip out process. Thus, the lower sacrificial layer 51A and the upper sacrificial layer 51B are simultaneously removed.

Accordingly, since the amorphous carbon layer 26 remains on the upper portion of the storage node 25 in an original deposition state, the amorphous carbon layer 26 serves as a supporter to prevent the storage node 25 from leaning toward a neighboring storage node during the full dip out process.

In the third embodiment, a process time of the full dip out process to remove oxide material is prolonged. Accordingly, a method for minimizing a thickness of the upper sacrificial layer 51B provides a modified example of the third embodiment. In other words, the upper sacrificial layer 51B is removed as much as possible during the partial wet dip out process. Thus, only the lower sacrificial layer 51A having a fast wet etching rate is removed in the full dip out process, thereby reducing a dip out time.

In another modified example of the third embodiment, even if the thickness of the upper sacrificial layer 51B is not minimized, a thick target for the partial wet dip out process may be employed.

The dip out time is prolonged in the partial dip out process so that a PE-TEOS material (having an initial thickness ranging approximately 10,000±5000 Å), which has a slower wet etching rate among heterogeneous sacrificial layers (e.g., PE-TEOS/PSG) stacked on the cell region, is removed as much as possible. Accordingly, when PSG having a faster wet etching rate in the subsequent full dip out process is removed, the remaining PE-TEOS material is removed.

As described above, if a target for the partial dip out process is increased, a process margin may be improved.

As described above, according to the present invention, a supporter having a mesh structure is employed. Thus, a leaning phenomenon of a cylindrical storage node can be prevented even if an aspect ratio exceeds 12:1 due to an increased height of the cylindrical storage node. Accordingly, when semiconductor devices under a 70 nm-level are integrated, cell capacitance may be increased due to the increase of an effective area of the storage nodes.

In a capacitor with a cylindrical storage node of a semiconductor memory device employing a metallization process under a 60 nm level, a method for fabricating a storage node according to the present invention achieves a storage node aspect ratio of 12:1. Thus, defects may be minimized so that a product yield is improved. In addition, the endurance and reliability of a product can be improved while ensuring a greater charge capacitance.

While the present invention has been described with respect to specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for fabricating a capacitor, the method comprising:
   forming a sacrificial layer on an upper portion of a substrate, wherein a plurality of trenches are formed in the sacrificial layer;
   forming storage nodes in the trenches;
   exposing upper portions of the storage nodes by removing a portion of the sacrificial layer;
   forming supporters to surround inner walls and outer walls of the exposed upper portions of the storage nodes;
   etching the supporters to form a mesh structure that couples the exposed upper portions of the storage nodes and has openings disposed between the storage nodes;
   removing the sacrificial layer under the mesh structure, wherein the mesh structure remains and provides support to the storage nodes during the removal of the sacrificial layer under the mesh structure; and
   removing the mesh structure after said removing the sacrificial layer under the mesh structure.

2. The method of claim 1, wherein forming the supporters comprises forming an amorphous carbon layer on the exposed upper portions of the storage nodes.

3. The method of claim 2, wherein the amorphous carbon layer is formed to have a step-coverage of approximately 20% or less.

4. The method of claim 2, wherein the amorphous carbon layer is formed through a plasma enhanced chemical vapor deposition (PECVD) process.

5. The method of claim 1, wherein the supporters include an amorphous carbon layer and the mesh structure is removed using oxygen plasma.

6. The method of claim 1, wherein the upper portions of the storage nodes are exposed and the sacrificial layer is removed through a wet dip out process, the sacrificial layer being an oxide layer.

7. The method of claim 6, wherein a target of the wet dip out process has a thickness corresponding to approximately 8% to approximately 80% of a thickness of an initial sacrificial layer when exposing the upper portions of the storage nodes.

8. The method of claim 6, wherein the wet dip out process is performed using a diluted HF solution, or a mixed solution of ammonium difluoride ($NH_4F$) and hydrogen fluoride (HF).

9. The method of claim 1, wherein the trenches are arranged in a zig-zag pattern.

10. The method of claim 1, wherein the supporters form a mesh structure in which the supporters are connected to each other in a portion having a narrow interval between neighboring storage nodes, and the supporters are disconnected from each other in a portion having a wide interval between neighboring storage nodes.

11. The method of claim 1, wherein the sacrificial layer is an oxide layer including one selected from a group consisting of phosphosilicate glass (PSG), borophosphosilicate glass (BPSG), plasma enhanced-tetra ethyl ortho silicate (PE-TEOS), undoped silicate glass (USG) and a combination thereof.

12. The method of claim 1, wherein the sacrificial layer is formed by stacking a first oxide layer and a second oxide layer, the second oxide layer having a wet etch rate that is lower than a wet etch rate of the first oxide layer.

13. The method of claim 12, wherein the wet etch rate is determined by a wet etching process using a diluted HF solution or a mixed solution of $NH_4F$ and HF.

14. The method of claim 12, wherein the first oxide layer includes PSG, BPSG, or USG, and the second oxide layer includes PETEOS.

15. The method of claim 12, wherein during removing the portion of the sacrificial layer, the second oxide layer is removed.

16. A method for fabricating a capacitor, the method comprising:
   forming a sacrificial layer on a substrate, wherein the substrate comprises a cell region and a peripheral region, a plurality of trenches being formed in the sacrificial layer of the cell region;
   forming storage nodes in the trenches;
   exposing upper portions of the storage nodes by removing a portion of the sacrificial layer;

forming supporters to support exposed upper portions of the storage nodes;

forming a capping layer on the supporters;

removing the capping layer in the peripheral region using a mask that exposes the peripheral region and covers the cell region;

removing the mask in the cell region and the supporters in the peripheral region;

removing the capping layer in the cell region and the sacrificial layer remaining in the cell region and the peripheral region; and removing the supporters in the cell region.

17. The method of claim 16, wherein forming the supporters comprises forming an amorphous carbon layer on the exposed upper portions of the storage nodes.

18. The method of claim 17, wherein forming the supporters further comprises etching a surface of the amorphous carbon layer, thereby forming the amorphous carbon layer having a mesh structure.

19. The method of claim 17, wherein the amorphous carbon layer is formed to have a step-coverage of approximately 20% or less.

20. The method of claim 17, wherein the amorphous carbon layer is formed by a PECVD process.

21. The method of claim 16, wherein the supporters include an amorphous carbon layer and the supporters are removed using oxygen plasma.

22. The method of claim 16, wherein the upper portions of the storage nodes are exposed and the sacrificial layer is removed through a wet dip out process, the sacrificial layer being an oxide layer.

23. The method of claim 22, wherein a target of the wet dip out process has a thickness corresponding to approximately 8% to approximately 80% of a thickness of an initial sacrificial layer when exposing the upper portions of the storage nodes.

24. The method of claim 22, wherein the wet dip out process is performed using a diluted HF solution or a mixed solution of $NH_4F$ and HF.

25. The method of claim 16, wherein the trenches are arranged in a zigzag pattern.

26. The method of claim 16, wherein the supporters form a mesh structure in which the supporters are connected to each other in a portion having a narrow interval between neighboring storage nodes and the supporters are disconnected from each other in a portion having a wide interval between neighboring storage nodes.

27. The method of claim 16, wherein the sacrificial layer is an oxide layer including one selected from a group consisting of a PSG, a BPSG, a PETEOS, a USG, and a combination thereof.

28. The method of claim 16, wherein the sacrificial layer is formed by stacking a first oxide layer and a second oxide layer, the second oxide layer having a wet etch rate that is lower than a wet etch rate of the first oxide layer.

29. The method of claim 28, wherein the wet etch rate is determined by a wet etching process using a diluted HF solution or a mixed solution of $NH_4F$ and HF.

30. The method of claim 28, wherein the first oxide layer includes a PSG, a BPSG, or a USG and the second oxide layer includes a PETEOS.

31. The method of claim 28, wherein during removing the portion of the sacrificial layer, the second oxide layer is removed.

32. The method of claim 16, wherein the sacrificial layer remaining in the cell region and the peripheral region is removed by a full dip out process such that a wet solution infiltrates into a central portion of a cell matrix having a plurality of cell regions, the wet solution infiltrating from borders of the cell matrix.

* * * * *